(12) United States Patent
Lee et al.

(10) Patent No.: US 10,431,779 B2
(45) Date of Patent: Oct. 1, 2019

(54) ORGANIC LAYER DEPOSITION APPARATUS, METHOD OF MANUFACTURING ORGANIC LIGHT-EMITTING DISPLAY APPARATUS USING THE SAME, AND ORGANIC LIGHT-EMITTING DISPLAY APPARATUS MANUFACTURED USING THE METHOD

(71) Applicant: Samsung Display Co., Ltd., Yongin-si, Gyeonggi-do (KR)

(72) Inventors: Su-Hwan Lee, Yongin-si (KR); Un-Cheol Sung, Yongin-si (KR); Chae-Woong Kim, Yongin-si (KR); Young-Mook Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 74 days.

(21) Appl. No.: 15/236,218

(22) Filed: Aug. 12, 2016

(65) Prior Publication Data

US 2016/0351860 A1  Dec. 1, 2016

(30) Foreign Application Priority Data

Jul. 10, 2012 (KR) .................. 10-2012-0075138
Jul. 13, 2012 (KR) .................. 10-2012-0076940
Oct. 4, 2012 (KR) .................. 10-2012-0110095

(51) Int. Cl.
*H01L 51/52* (2006.01)
*H01L 51/56* (2006.01)
(Continued)

(52) U.S. Cl.
CPC .............. *H01L 51/56* (2013.01); *B05D 1/60* (2013.01); *C23C 14/04* (2013.01); *C23C 14/12* (2013.01);
(Continued)

(58) Field of Classification Search
None
See application file for complete search history.

(56) References Cited

U.S. PATENT DOCUMENTS 4,468,648 A  8/1984  Uchikune
5,296,122 A  3/1994  Katsube et al.
(Continued)

FOREIGN PATENT DOCUMENTS

CN  1704501 A  12/2005
CN  1841696 A  10/2006
(Continued)

OTHER PUBLICATIONS

SIPO Granted Document dated Apr. 12, 2017, for corresponding Chinese Patent Application No. 201310285678.4 (54 pages).
(Continued)

*Primary Examiner* — Michael Lebentritt
(74) *Attorney, Agent, or Firm* — Lewis Roca Rothgerber Christie LLP

(57) ABSTRACT

An organic layer deposition apparatus, a method of manufacturing an organic light-emitting display apparatus by using the same, and an organic light-emitting display apparatus manufactured using the method. The organic layer deposition apparatus includes a conveyer unit including first and second conveyer units, loading and unloading units, and a deposition unit. A transfer unit moves between the first and second conveyer units, and the substrate attached to the transfer unit is spaced from a plurality of organic layer deposition assemblies of the deposition unit while being transferred by the first conveyer unit. The organic layer deposition assemblies include common layer deposition assemblies and pattern layer deposition assemblies.

23 Claims, 25 Drawing Sheets

(51) Int. Cl.

| | | |
|---|---|---|
| *H01L 27/32* | (2006.01) | |
| *H01L 51/00* | (2006.01) | |
| *C23C 14/04* | (2006.01) | |
| *C23C 14/12* | (2006.01) | |
| *C23C 14/24* | (2006.01) | |
| *C23C 14/56* | (2006.01) | |
| *B05D 1/00* | (2006.01) | |

(52) U.S. Cl.
CPC ............ *C23C 14/24* (2013.01); *C23C 14/243* (2013.01); *C23C 14/56* (2013.01); *H01L 27/32* (2013.01); *H01L 27/326* (2013.01); *H01L 51/0008* (2013.01); *H01L 2227/323* (2013.01)

(56) References Cited

U.S. PATENT DOCUMENTS

| | | |
|---|---|---|
| 5,487,609 A | 1/1996 | Asada |
| 5,909,995 A | 6/1999 | Wolf et al. |
| 6,136,458 A | 10/2000 | Inoue |
| 6,274,198 B1 | 8/2001 | Dautartas |
| 6,371,451 B1 | 4/2002 | Choi |
| 6,483,690 B1 | 11/2002 | Nakajima et al. |
| 6,749,906 B2 | 6/2004 | Van Slyke |
| 6,995,035 B2 | 2/2006 | Cok et al. |
| 7,964,037 B2 | 6/2011 | Fukuda et al. |
| 8,936,956 B2 * | 1/2015 | Han ......................... H01L 51/56 438/28 |
| 9,496,317 B2 | 11/2016 | Choi et al. |
| 2001/0006827 A1 | 7/2001 | Yamazaki et al. |
| 2002/0076847 A1 | 6/2002 | Yamada et al. |
| 2002/0168577 A1 | 11/2002 | Yoon |
| 2002/0194727 A1 | 12/2002 | Cho et al. |
| 2003/0101937 A1 | 6/2003 | Van Slyke et al. |
| 2003/0168013 A1 | 9/2003 | Freeman et al. |
| 2003/0207500 A1 | 11/2003 | Pichler et al. |
| 2003/0221614 A1 | 12/2003 | Kang et al. |
| 2003/0232563 A1 | 12/2003 | Kamiyama et al. |
| 2004/0115338 A1 | 6/2004 | Yoneda |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0166842 A1 | 8/2005 | Sakamoto |
| 2005/0263074 A1 | 12/2005 | Masuda et al. |
| 2006/0102078 A1 | 5/2006 | Fairbairn et al. |
| 2006/0144325 A1 | 7/2006 | Jung et al. |
| 2006/0164786 A1 | 7/2006 | Kobayashi et al. |
| 2006/0174829 A1 | 8/2006 | An et al. |
| 2006/0205101 A1 | 9/2006 | Lee et al. |
| 2006/0255722 A1 | 11/2006 | Imanishi |
| 2006/0278522 A1 | 12/2006 | Kim et al. |
| 2007/0009652 A1 | 1/2007 | Manz et al. |
| 2007/0022955 A1 | 2/2007 | Bender et al. |
| 2007/0046913 A1 | 3/2007 | Shibazaki |
| 2007/0077358 A1 | 4/2007 | Jeong et al. |
| 2007/0178708 A1 | 8/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0018841 A1 | 1/2008 | Rho et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2008/0298947 A1 | 12/2008 | Yeo et al. |
| 2009/0017192 A1 | 1/2009 | Matsuura |
| 2009/0153033 A1 | 6/2009 | Lee et al. |
| 2009/0229524 A1 | 9/2009 | Kim et al. |
| 2009/0232976 A1 | 9/2009 | Yoon et al. |
| 2009/0291610 A1 | 11/2009 | Sasaki |
| 2009/0304907 A1 | 12/2009 | Koparal |
| 2010/0130020 A1 | 5/2010 | Kim et al. |
| 2010/0156279 A1 | 6/2010 | Tamura et al. |
| 2010/0206222 A1 | 8/2010 | Sung et al. |
| 2010/0328197 A1 | 12/2010 | Lee et al. |
| 2011/0045617 A1 | 2/2011 | Kang et al. |
| 2011/0052791 A1 | 3/2011 | Jo et al. |
| 2011/0053300 A1 | 3/2011 | Ryu et al. |
| 2011/0053301 A1 * | 3/2011 | Kang ...................... C23C 14/12 438/34 |
| 2011/0239941 A1 | 10/2011 | Nakagawa et al. |
| 2011/0241438 A1 | 10/2011 | Kim et al. |
| 2012/0068201 A1 * | 3/2012 | Sung ...................... C23C 14/042 257/88 |
| 2013/0109189 A1 | 5/2013 | Cho et al. |
| 2013/0341598 A1 * | 12/2013 | Chang ..................... C23C 14/12 257/40 |
| 2014/0014917 A1 * | 1/2014 | Lee ......................... H01L 51/56 257/40 |
| 2014/0014918 A1 * | 1/2014 | Han ..................... H01L 51/0002 257/40 |
| 2014/0014919 A1 * | 1/2014 | Na ....................... H01L 27/3241 257/40 |
| 2014/0014920 A1 * | 1/2014 | Lee ........................ H01L 27/326 257/40 |
| 2014/0014921 A1 * | 1/2014 | Choi ........................ H01L 51/56 257/40 |
| 2014/0014924 A1 * | 1/2014 | Oh .......................... H01L 51/56 257/40 |
| 2014/0014929 A1 * | 1/2014 | Lee ......................... H01L 51/56 257/40 |
| 2014/0034917 A1 * | 2/2014 | Lee ......................... H01L 51/56 257/40 |
| 2014/0084263 A1 * | 3/2014 | Jin ....................... C23C 14/042 257/40 |
| 2014/0131667 A1 * | 5/2014 | Chang ..................... H01L 51/56 257/40 |
| 2014/0284559 A1 * | 9/2014 | Kim ........................ H01L 51/56 257/40 |
| 2014/0284561 A1 * | 9/2014 | Chang ................ H01L 51/0012 257/40 |
| 2014/0291619 A1 * | 10/2014 | Lee ...................... C23C 14/042 257/40 |
| 2014/0291620 A1 * | 10/2014 | Choi ................... C23C 14/042 257/40 |
| 2014/0326275 A1 | 11/2014 | Kim |
| 2014/0329349 A1 * | 11/2014 | Seo ...................... C23C 14/042 438/34 |
| 2014/0346467 A1 * | 11/2014 | Yun ........................ H01L 51/56 257/40 |
| 2015/0056370 A1 * | 2/2015 | Lee ...................... C23C 14/042 427/162 |
| 2015/0179710 A1 | 6/2015 | Choi et al. |

FOREIGN PATENT DOCUMENTS

| | | |
|---|---|---|
| CN | 1904130 A | 1/2007 |
| EP | 1 413 644 A2 | 4/2004 |
| EP | 1 418 250 A2 | 5/2004 |
| EP | 1 518 940 A1 | 3/2005 |
| JP | 61-46017 | 3/1986 |
| JP | 61-85871 | 5/1986 |
| JP | 04-272170 A | 9/1992 |
| JP | 5-22405 U | 3/1993 |
| JP | H0995762 | 4/1997 |
| JP | 10-120171 A | 5/1998 |
| JP | 2000-068054 A | 3/2000 |
| JP | 2001-028325 A | 1/2001 |
| JP | 2001-052862 A | 2/2001 |
| JP | 2001-093667 A | 4/2001 |
| JP | 2002-075638 A | 3/2002 |
| JP | 2002-175878 A | 6/2002 |
| JP | 2003-3250 A | 1/2003 |
| JP | 2003-077662 A | 3/2003 |
| JP | 2003-157973 A | 5/2003 |
| JP | 2003-297562 A | 10/2003 |
| JP | 2003-347394 A | 12/2003 |

(56) References Cited

FOREIGN PATENT DOCUMENTS

| | | |
|---|---|---|
| JP | 2004-043898 A | 2/2004 |
| JP | 2004-103269 A | 4/2004 |
| JP | 2004-103341 A | 4/2004 |
| JP | 2004-199919 A | 7/2004 |
| JP | 2004-225058 A | 8/2004 |
| JP | 2004-342455 A | 12/2004 |
| JP | 2005-044592 A | 2/2005 |
| JP | 2005-213616 A | 8/2005 |
| JP | 2005-235568 A | 9/2005 |
| JP | 2005-293968 A | 10/2005 |
| JP | 2005-296737 A | 10/2005 |
| JP | 2005-350692 A | 12/2005 |
| JP | 2006-275433 A | 10/2006 |
| JP | 2006-302898 A | 11/2006 |
| JP | 2006-307247 A | 11/2006 |
| JP | 2007-047293 A | 2/2007 |
| JP | 2008-019477 A | 1/2008 |
| JP | 2008-121098 A | 5/2008 |
| JP | 2008-187006 A | 8/2008 |
| JP | 2009-019243 A | 1/2009 |
| JP | 2009-87910 A | 4/2009 |
| JP | 2009-117231 A | 5/2009 |
| JP | 2010-159167 A | 7/2010 |
| JP | 2011-47035 A | 3/2011 |
| KR | 1997-0008709 A | 2/1997 |
| KR | 10-0257219 B1 | 2/2000 |
| KR | 10-2000-0019254 A | 4/2000 |
| KR | 10-2000-0023929 A | 5/2000 |
| KR | 10-2001-0059939 A | 7/2001 |
| KR | 10-2002-0000201 A | 1/2002 |
| KR | 10-2002-0050922 A | 6/2002 |
| KR | 10-2002-0088662 A | 11/2002 |
| KR | 10-2002-0090934 A | 12/2002 |
| KR | 2003-0043012 A | 6/2003 |
| KR | 10-0405080 B1 | 11/2003 |
| KR | 10-0406059 B1 | 11/2003 |
| KR | 10-2003-0091947 A | 12/2003 |
| KR | 10-2003-0093959 A | 12/2003 |
| KR | 10-0430336 A | 3/2004 |
| KR | 10-2004-0034537 A | 4/2004 |
| KR | 10-2004-0050045 | 6/2004 |
| KR | 10-2004-0050045 A | 6/2004 |
| KR | 10-2004-0069281 A | 8/2004 |
| KR | 10-2004-0084747 A | 10/2004 |
| KR | 10-0463212 B1 | 12/2004 |
| KR | 10-2005-0024324 A | 3/2005 |
| KR | 10-2005-0033962 | 4/2005 |
| KR | 10-0520159 B1 | 10/2005 |
| KR | 10-2006-0008602 A | 1/2006 |
| KR | 10-2006-0018745 A | 3/2006 |
| KR | 10-2006-0068682 A | 6/2006 |
| KR | 10-2006-0073367 A | 6/2006 |
| KR | 10-2006-0077887 A | 7/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109627 A | 10/2006 |
| KR | 10-0646160 B1 | 11/2006 |
| KR | 10-0687007 B1 | 2/2007 |
| KR | 10-2007-0025164 | 3/2007 |
| KR | 10-0696547 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-0711885 B1 | 4/2007 |
| KR | 10-2007-0050793 A | 5/2007 |
| KR | 10-2007-0056190 A | 6/2007 |
| KR | 10-0723627 B1 | 6/2007 |
| KR | 10-0726132 B1 | 6/2007 |
| KR | 10-0736218 B1 | 7/2007 |
| KR | 10-0741142 B1 | 7/2007 |
| KR | 10-2007-0078713 A | 8/2007 |
| KR | 10-2007-0080635 A | 8/2007 |
| KR | 10-2007-0091437 A | 9/2007 |
| KR | 10-2007-0101842 A | 10/2007 |
| KR | 10-2007-0105595 A | 10/2007 |
| KR | 10-0770653 B1 | 10/2007 |
| KR | 10-2008-0001184 A | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 B1 | 1/2008 |
| KR | 10-0823508 B1 | 4/2008 |
| KR | 10-2008-0038650 A | 5/2008 |
| KR | 10-2008-0044239 A | 5/2008 |
| KR | 10-2008-0046761 A | 5/2008 |
| KR | 10-0827760 B1 | 5/2008 |
| KR | 10-2008-0057159 A | 6/2008 |
| KR | 10-0839380 B1 | 6/2008 |
| KR | 10-2008-0060400 A | 7/2008 |
| KR | 10-2008-0061132 A | 7/2008 |
| KR | 10-2008-0062212 A | 7/2008 |
| KR | 10-2008-0076574 A | 8/2008 |
| KR | 10-2008-0104479 A | 12/2008 |
| KR | 10-2008-0104695 A | 12/2008 |
| KR | 10-2009-0038733 A | 4/2009 |
| KR | 10-0899279 B1 | 5/2009 |
| KR | 10-2009-0060835 | 6/2009 |
| KR | 10-2009-0066996 A | 6/2009 |
| KR | 10-2009-0075887 A | 7/2009 |
| KR | 10-2009-0079765 A | 7/2009 |
| KR | 10-2009-0081717 A | 7/2009 |
| KR | 10-2009-0094911 A | 9/2009 |
| KR | 10-2009-0097453 A | 9/2009 |
| KR | 10-2010-0038088 A | 4/2010 |
| KR | 10-2010-0044606 A | 4/2010 |
| KR | 10-2010-0094802 A | 8/2010 |
| KR | 10-2010-0117438 | 11/2010 |
| KR | 10-2010-0117438 A | 11/2010 |
| KR | 10-2010-0128589 A | 12/2010 |
| KR | 10-2010-0138139 | 12/2010 |
| KR | 10-2011-0010572 | 2/2011 |
| KR | 10-1017654 B1 | 2/2011 |
| KR | 10-2011-0020710 | 3/2011 |
| KR | 10-2011-0021623 A | 3/2011 |
| KR | 10-2011-0110525 A | 10/2011 |
| KR | 10-2011-0112220 A | 10/2011 |
| KR | 10-2012-0029164 | 3/2012 |
| KR | 10-2012-0029164 A | 3/2012 |
| KR | 10-1174877 | 8/2012 |
| KR | 10-2013-0008779 | 1/2013 |
| KR | 10-2013-0008779 A | 1/2013 |
| KR | 10-2014-0130963 | 11/2014 |
| RU | 2063473 | 7/1996 |
| SU | 1199455 | 12/1985 |
| WO | WO 03/043067 A1 | 5/2003 |
| WO | WO 2004/016406 A1 | 2/2004 |

OTHER PUBLICATIONS

Patent Abstracts of Japan and English Machine Translation of JP 2001-052862 A, 20 pages.
Patent Abstracts of Japan and English Machine Translation of JP 2003-3250 A, 25 pages.
Korean Patent Abstracts, Publication No. 10-0151312 B1, dated Jun. 18, 1998, corresponding to Korean Publication 1997-0008709 A listed above.
Korean Patent Abstracts, Publication No. 1020010062735 A, dated Jul. 7, 2001, for corresponding Korean Patent 10-0827760 B1 listed above.
Korean Patent Abstracts, Publication No. 1020020034272 A, dated May 9, 2002, for corresponding Korean Patent 10-0726132 B1 listed above.
Korean Patent Abstracts, Publication No. 1020020056238 A, dated Jul. 10, 2002, for corresponding Korean Patent KR 10-0698033 B1 listed above.
Korean Patent Abstracts, Publication No. 1020020086047 A, dated Nov. 18, 2002, for corresponding Korean Patent 10-0405080 B1 listed above.

(56) References Cited

OTHER PUBLICATIONS

Korean Patent Abstracts, Publication No. 1020020088662 A, dated Nov. 29, 2002, for corresponding Korean Patent KR 10-0463212 B1 listed above.
Korean Patent Abstracts, Publication No. 1020040062203 A, dated Jul. 7, 2004, for corresponding Korean Patent R 10-0646160 B1 listed above.
Korean Patent Abstracts, Publication No. 1020050045619 A, dated May 17, 2005, for corresponding Korean Patent KR 10-0520159 B1 listed above.
Korean Patent Abstracts, Publication No. 1020050078637 A, dated Aug. 5, 2005, for corresponding Korean Patent KR 10-0700466 B1 listed above.
Korean Patent Abstracts, Publication No. 1020060101987 A, dated Sep. 27, 2006, for corresponding KR 10-0687007 B1 listed above.
Korean Patent Abstracts, Publication No. 1020060126267 A, dated Dec. 7, 2006, for corresponding Korean Patent 10-0797787 B1 listed above.
Korean Patent Abstracts, Publication No. 1020070025164 A, dated Mar. 8, 2007, for corresponding Korean Patent 10-0711885 B1 listed above.
Korean Patent Abstracts, Publication No. 10-2007-0056241 A, dated Jun. 4, 2007, for corresponding Korean Patent 10-0741142 B1 listed above.
Espacenet—Bibliographic data, Publication No. KR20080002189 A, dated Jan. 4, 2008, for corresponding Korean Patent KR 10-0800125 B1 listed above.
Korean Patent Abstracts, Publication No. 1020080038650 A, dated May 7, 2008, for corresponding Korean Patent KR 10-0839380 B1 listed above.
Korean Patent Abstracts, Publication No. 10-2008-0070302 A, dated Jul. 30, 2008, for corresponding Korean Patent 10-0899279 B1 listed above.
CN Office action dated Oct. 9, 2012, for CN application 201010266406.6, 6 pages.
European Search Report dated May 27, 2011, for corresponding European Patent application 10251514.5, 11 pages.
KIPO Office action dated Feb. 6, 2012, for Korean Patent application 10-2010-0011480, 8 pages.
KIPO Office action dated Feb. 6, 2012, for Korean Patent application 10-2010-0011481, 7 pages.
KIPO Office action dated Apr. 9, 2012, for Korean priority Patent application 10-2010-0031556, 4 pages.
KIPO Notice of Allowance dated Apr. 26, 2012, for Korean Patent application 10-2010-0066991, 5 pages.
KIPO Registration Determination Certificate dated Jul. 2, 2012, for Korean Patent application 10-2010-0011480, 5 pages.
KIPO Registration Determination Certificate dated Jul. 2, 2012, for Korean priority Patent application 10-2010-0011481, 5 pages.
U.S. Office action dated Jun. 21, 2011, for cross reference (U.S. Appl. No. 12/862,153, now U.S. Pat. No. 8,137,466), 21 pages.
U.S. Office action dated Oct. 3, 2012, for cross reference U.S. Appl. No. 12/869,830, 28 pages.
U.S. Office action dated Mar. 20, 2015, for cross reference U.S. Appl. No. 14/295,245, 10 pages.
U.S. Notice of Allowance dated Sep. 22, 2014, issued in U.S. Appl. No. 14/099,540 (9 pages).
U.S. Office Action dated Dec. 30, 2016, issued in U.S. Appl. No. 14/217,188 (10 pages).
U.S. Office Action dated Jul. 10, 2017, issued in U.S. Appl. No. 14/217,188 (13 pages).
U.S. Final Office Action dated Jan. 23, 2018, issued in U.S. Appl. No. 14/217,188 (15 pages).
Korean Registration Decision dated Dec. 18, 2018 for the corresponding Korean Patent Application No. 10-0075138, 2 pages.
Korean Registration Decision dated Dec. 20, 2018 for the corresponding Korean Patent Application No. 10-0076940, 2 pages.
U.S. Final Office Action dated Feb. 7, 2019, issued in U.S. Appl. No. 14/217,188 (15 pages).

\* cited by examiner

ORGANIC LAYER DEPOSITION APPARATUS, METHOD OF MANUFACTURING ORGANIC LIGHT-EMITTING DISPLAY APPARATUS USING THE SAME, AND ORGANIC LIGHT-EMITTING DISPLAY APPARATUS MANUFACTURED USING THE METHOD

CROSS-REFERENCE TO RELATED APPLICATIONS

This application is a divisional of U.S. patent application Ser. No. 13/938,173, filed Jul. 9, 2013, which claims priority to and the benefit of Korean Patent Application No. 10-2012-0075138, filed on Jul. 10, 2012 in the Korean Intellectual Property Office, Korean Patent Application No. 10-2012-0076940, filed on Jul. 13, 2012 in the Korean Intellectual Property Office, and Korean Patent Application No. 10-2012-0110095, filed on Oct. 4, 2012, the entire contents of all of which are incorporated herein by reference.

BACKGROUND

1. Field

Aspects of embodiments of the present invention relate to an organic layer deposition apparatus, a method of manufacturing an organic light-emitting display apparatus (organic light-emitting display device) by using the same, and an organic light-emitting display apparatus manufactured using the method.

2. Description of the Related Art

Organic light-emitting display apparatuses (organic light-emitting display devices) have wider viewing angles, better contrast characteristics, and faster response speeds than other display devices, and thus they have drawn attention as a next-generation display device.

An organic light-emitting display apparatus includes intermediate layers, which include an emission layer, located between a first electrode and a second electrode facing the first electrode. The electrodes and the intermediate layers may be formed using various methods, one of which is an independent deposition method. When an organic light-emitting display apparatus is manufactured using a deposition method, a fine metal mask (FMM) having the same pattern as that of an organic layer to be formed is positioned to closely contact a substrate on which the organic layer and the like are to be formed, and an organic layer material is deposited through the FMM to form an organic layer having a desired pattern.

However, the deposition method using such an FMM presents difficulties in manufacturing large organic light-emitting display apparatuses using a large mother glass. For example, when a large mask is used, the mask may bend due to its own weight (self-gravity) to thereby distort a pattern. Such disadvantages might make the FMM method undesirable in view of the recent trend towards high-definition patterns.

Moreover, processes of aligning a substrate and an FMM to closely contact each other, performing deposition thereon, and separating the FMM from the substrate are time-consuming, resulting in a long manufacturing time, and may result in low production efficiency.

Information disclosed in this Background section was already known by the inventors of the present invention before achieving the present invention or is technical information acquired in the process of achieving the present invention. Therefore, it may contain information that does not form the prior art that is already known in this country to a person of ordinary skill in the art.

SUMMARY

In order to address the drawback of the deposition method using a fine metal mask (FMM) and/or other issues, aspects of the present invention are directed toward organic layer deposition apparatuses that are suitable for use in the mass production of a large substrate, enable high-definition patterning, and reduce time and costs for the correction/compensating for a thickness of an organic layer, methods of manufacturing organic light-emitting display apparatuses (organic light-emitting display devices) by using the same, and organic light-emitting display apparatuses manufactured using the methods.

According to an embodiment of the present invention, an organic layer deposition apparatus is provided. The organic layer deposition apparatus includes: a conveyer unit including a transfer unit for attaching a substrate and configured to move along with the substrate, a first conveyer unit for moving in a first direction the transfer unit on which the substrate is attached, and a second conveyer unit for moving in a direction opposite to the first direction the transfer unit from which the substrate is separated after deposition has been completed; a loading unit for attaching the substrate on the transfer unit; a deposition unit including a chamber configured to be maintained in a vacuum state and a plurality of organic layer deposition assemblies for depositing an organic layer on the substrate attached to the transfer unit transferred from the loading unit; and an unloading unit for separating, from the transfer unit, the substrate on which the deposition has been completed while passing through the deposition unit, wherein the transfer unit is configured to move between the first conveyer unit and the second conveyer unit, the transfer unit is configured for the attached substrate to be spaced from the plurality of organic layer deposition assemblies while being transferred by the first conveyer unit, each of the plurality of organic layer deposition assemblies includes: a plurality of deposition sources, each of the plurality of deposition sources being configured to discharge a corresponding one of a plurality of deposition materials; and a deposition source nozzle unit at a side of each of the deposition sources, and including one or more deposition source nozzles, the organic layer deposition assemblies include a plurality of common layer deposition assemblies for forming a common layer and a plurality of pattern layer deposition assemblies for forming a pattern layer, each of the pattern layer deposition assemblies further includes a correction slit sheet including a plurality of correction slits, correction slits of the pattern layer deposition assemblies are offset with respect to each other along the first direction, and the deposition materials discharged from the deposition sources pass through respective said correction slit sheets and are deposited in a pattern on the substrate.

In one embodiment, each of the correction slits extends in the first direction.

Locations of the correction slits of the correction slit sheets in different pattern layer deposition assemblies may be different from each other in the first direction.

Pattern layers deposited on the substrate through the correction slit sheets may not overlap each other.

The correction slits of the correction slit sheets may have equal lengths.

The correction slits of the correction slit sheets may have different lengths.

A length of the correction slits of the correction slit sheets may increase as the correction slits are farther away from respective centers of the correction slit sheets.

The organic layer deposition apparatus may further include a correction plate located at a side of a corresponding one of the correction slit sheets and shielding at least a portion of the deposition material discharged from the deposition source.

A width of the correction plate may decrease from a center towards an edge of a corresponding one of the correction slit sheets.

The correction plate may have a shape of a circular arc or cosine.

A width of the correction plate at a region corresponding to a center of a corresponding one of the correction slit sheets may be greater than that at an edge of the correction plate.

The correction plate may have a shape such that the deposition material is better shielded at a center of the correction slit sheet than at an edge of the correction slit sheet.

The first conveyer unit and the second conveyer unit may be configured to pass through the deposition unit.

The first conveyer unit and the second conveyer unit may be arranged one on top of the other and may be parallel to each other.

The first conveyer unit may be configured to move the transfer unit to sequentially pass through the loading unit, the deposition unit, and the unloading unit in that order.

The second conveyer unit may be configured to move the transfer unit to sequentially pass through the unloading unit, the deposition unit, and the loading unit in this stated order.

A length of the correction slit sheets of the organic layer deposition assemblies in at least one of the first direction or the second direction may be smaller than that of the substrate.

According to another embodiment of the present invention, a method of manufacturing an organic light-emitting display apparatus by using an organic layer deposition apparatus for forming an organic layer on a substrate, is provided. The method includes: attaching a substrate to a transfer unit in a loading unit; transporting, into a chamber, the transfer unit to which the substrate is attached, by using a first conveyer unit passing through the chamber; depositing deposition materials discharged from a plurality of organic layer deposition assemblies to form organic layers on the substrate while the substrate is moved relative to the organic layer deposition assemblies, the organic layer deposition assemblies being in the chamber and spaced apart from the substrate; separating from the transfer unit the substrate on which the depositing has been completed in an unloading unit; and transporting the transfer unit from which the substrate is separated to the loading unit by using a second conveyer unit installed to pass through the chamber, wherein each of the plurality of organic layer deposition assemblies includes: a plurality of deposition sources, each of the plurality of deposition sources being configured to discharge a corresponding one of a plurality of deposition materials; and a deposition source nozzle unit at a side of each of the deposition sources, and including one or more deposition source nozzles, the organic layer deposition assemblies include a plurality of common layer deposition assemblies for forming a common layer and a plurality of pattern layer deposition assemblies for forming a pattern layer, each of the pattern layer deposition assemblies further includes a correction slit sheet including a plurality of correction slits, the correction slits of the pattern layer deposition assemblies are offset with respect to each other along a first direction in which the substrate is transported, and the substrate is spaced apart from the organic layer deposition apparatus so as to be relatively movable with respect to the organic layer deposition apparatus, and the deposition materials discharged from the deposition sources pass through respective said correction slit sheets and are deposited in a pattern on the substrate.

The chamber may accommodate the organic layer deposition assemblies with which deposition is continuously performed on the substrate.

The transfer unit may circulate between the first conveyer unit and the second conveyer unit.

The first conveyer unit and the second conveyer unit may be arranged in parallel and one on top of the other.

A length of patterning slit sheets of the organic layer deposition assemblies in at least one of the first direction or a second direction perpendicular to the first direction may be less than that of the substrate.

According to another embodiment of the present invention, an organic light-emitting display apparatus includes: a substrate; a plurality of thin film transistors on the substrate and each including a semiconductor active layer, a gate electrode insulated from the semiconductor active layer, and source and drain electrodes each contacting the semiconductor active layer; a plurality of pixel electrodes respectively on the thin film transistors; a plurality of organic layers respectively on the plurality of pixel electrodes; and a counter electrode on the plurality of organic layers, wherein a length of a slanted side between a top side and a bottom side of at least one of the organic layers on the substrate farther from a center of a deposition region is greater than lengths of slanted sides of other ones of the organic layers formed closer to the center of the deposition region, and the at least one of the organic layers on the substrate is a linearly-patterned organic layer formed using the organic layer deposition apparatus described above.

The substrate may have a size of 40 inches or more.

Each of the organic layers may include at least an emission layer.

The organic layers may have a non-uniform thickness.

Among the organic layers located in the deposition region, an organic layer located farther from the center of the deposition region may have a narrower interval between facing sides of a pattern of the organic layer extending in the first direction than the organic layers located closer to the center.

The farther the organic layer in the deposition region is from the center of the deposition region, the narrower an overlapping region of two sides of the organic layer may be.

Slanted sides between top and bottom side of the organic layer disposed at the center of the deposition region may have substantially equal lengths.

The organic layers in the deposition region may be symmetrically arranged about the center of the deposition region.

According to another embodiment of the present invention, an organic layer deposition apparatus is provided. The organic layer deposition apparatus includes: a conveyer unit including a transfer unit for attaching a substrate and configured to move along with the substrate, a first conveyer unit for moving in a first direction the transfer unit on which the substrate is attached, and a second conveyer unit for moving in a direction opposite to the first direction the transfer unit from which the substrate is separated after deposition has been completed; a loading unit for attaching the substrate to the transfer unit; a deposition unit including a chamber maintained in a vacuum state and a plurality of organic layer deposition assemblies for depositing organic layers on the substrate attached to the transfer unit transferred from the loading unit; and an unloading unit for separating, from the transfer unit, the substrate on which the deposition has been completed while passing through the deposition unit. The transfer unit is configured to move between the first conveyer unit and the second conveyer unit, and the substrate attached to the transfer unit is configured to be spaced from the plurality of organic layer deposition assemblies while being transferred by the first conveyer unit. Each of the plurality of organic layer deposition assemblies includes: a plurality of deposition sources, each of the plurality of deposition sources being configured to discharge a corresponding one of a plurality of deposition materials; a deposition source nozzle unit at a side of each of the plurality of deposition sources and including one or more deposition source nozzles; a patterning slit sheet facing the deposition source nozzle unit and including one or more patterning slits; and a modification shutter located between the plurality of deposition sources and the patterning slit sheet and including an opening that is configured to allow the deposition material to pass-through towards the patterning slit sheet. The openings of adjacent ones of the modification shutters are offset from each other along a second direction perpendicular to the first direction, and the deposition materials discharged from the plurality of deposition sources pass through the patterning slit sheet and are deposited on the substrate in patterns.

The opening of the modification shutter may be elongated in the first direction.

Locations of the openings of the modification shutters may be different from each other.

The patterns deposited on the substrate through the openings may not overlap each other.

In one embodiment, when thicknesses of the plurality of organic layers are measured, a modifying substrate is transferred through the organic layer deposition apparatus, and the modification shutter is located between the plurality of deposition sources and the patterning slit sheet such that the deposition materials are deposited on the modifying substrate by passing through the opening of the modification shutter.

The deposition unit may include m organic layer deposition assemblies, each of the m organic layer deposition assemblies may include n deposition sources, and each of the m organic layer deposition assemblies may include one modification shutter, wherein m and n are natural numbers.

In one embodiment, when the thicknesses of the plurality of organic layers are measured, the (n−1)th deposition source is activated, and the modifying substrate is transferred in the first direction and the deposition material is deposited on the modifying substrate from the activated (n−1)th deposition source while the deposition materials of the deposition sources other than the (n−1)th deposition source are blocked from reaching the modifying substrate, and after the modifying substrate is out of the deposition unit, the (n)th deposition source is activated, and the modifying substrate is transferred in the first direction and the deposition material is deposited on the modifying substrate from the activated (n)th deposition source while the deposition materials of the deposition sources other than the (n)th deposition source are blocked from reaching the modifying substrate.

Each of the plurality of organic layer deposition assemblies may include a same number of the plurality of deposition sources, and a number of modifying substrates used to measure the thicknesses of the organic layers and the number of the plurality of deposition sources may be same.

The first conveyer unit and the second conveyer unit may be configured to pass through the deposition unit.

The first conveyer unit and the second conveyer unit may be arranged parallel to each other one on top of the other.

The first conveyer unit may be configured to sequentially transfer the transfer unit into the loading unit, the deposition unit, and the unloading unit.

The second conveyer unit may be configured to sequentially transport the transfer unit into the unloading unit, the deposition unit, and the loading unit.

The patterning slit sheet of each of the plurality of organic layer deposition assemblies may be smaller than the substrate in at least one of the first direction or the second direction perpendicular to the first direction.

The deposition source nozzle unit may include a plurality of deposition source nozzles arranged along the second direction perpendicular to the first direction, the patterning slit sheet may include a plurality of patterning slits arranged along the second direction, and the organic layer deposition apparatus may further include a shielding plate assembly arranged along the second direction between the deposition source nozzle unit and the patterning slit sheet and including a plurality of shielding plates for defining a space between the deposition source nozzle unit and the patterning slit sheet to a plurality of deposition spaces.

Each of the plurality of shielding plates may extend along the first direction.

The shielding plate assembly may include a first shielding plate assembly including a plurality of first shielding plates and a second shielding plate assembly including a plurality of second shielding plates.

Each of the plurality of first shielding plates and each of the plurality of second shielding plates may be arranged along the second direction such as to define the space between the deposition source nozzle unit and the patterning slit sheet to the plurality of deposition spaces.

The deposition source nozzle unit may include a plurality of deposition source nozzles arranged along the first direction, and the patterning slit sheet may have a plurality of patterning slits arranged along the second direction perpendicular to the first direction.

The plurality of deposition sources, the deposition source nozzle unit, and the patterning slit sheet may be integrally formed by being connected to each other via a connecting member.

The connecting member may be configured to guide a flow path of the deposition material.

The connecting member may be configured to seal a space between the deposition source nozzle and the patterning slit sheet.

In another embodiment according to the present invention, a method of manufacturing an organic light-emitting display apparatus by using an organic layer deposition apparatus for forming an organic layer on a substrate is provided. The method includes: attaching the substrate to a transfer unit in a loading unit; transporting, into a chamber, the transfer unit to which the substrate is attached, by using a first conveyer unit passing through the chamber; forming organic layers by depositing deposition materials discharged from a plurality of organic layer deposition assemblies on the substrate while the substrate is spaced apart from and moved relative to the organic layer deposition assemblies in the chamber; separating the substrate on which the depositing has been completed from the transfer unit in an unloading unit; and transporting the transfer unit from which the substrate is separated to the loading unit by using a second conveyer unit passing through the chamber. Each of the organic layer deposition assemblies includes: a plurality of deposition sources, each of the deposition sources being configured to discharge a corresponding one of the deposition materials; a deposition source nozzle unit at a side of each of the plurality of deposition sources and comprising one or more deposition source nozzles; a patterning slit sheet facing the deposition source nozzle unit and comprising one or more patterning slits; and a modification shutter located between the plurality of deposition sources and the patterning slit sheet and having an opening that is configured to allow the corresponding ones of the deposition materials from the deposition sources to pass-through towards the patterning slit sheet. The openings of adjacent ones of the modification shutters are offset from each other along a second direction perpendicular to a first direction in which the substrate is transported, and the deposition materials discharged from the plurality of deposition sources pass through the patterning slit sheet and are deposited on the substrate in patterns.

The chamber may include a plurality of the organic layer deposition assemblies, and wherein deposition may be sequentially performed on the substrate by using each of the plurality of the organic layer deposition assemblies.

The transfer unit may be moved between the first conveyer unit and the second conveyer unit.

The first conveyer unit and the second conveyer unit may be arranged in parallel to each other above and below.

The patterning slit sheet of the organic layer deposition assembly may be formed smaller than the substrate in at least one of a first direction or the second direction perpendicular to the first direction.

In another embodiment according to the present invention, an organic light-emitting display apparatus is provided. The organic light-emitting display apparatus includes: a substrate; at least one thin film transistor on the substrate and including a semiconductor active layer, a gate electrode insulated from the semiconductor active layer, and source and drain electrodes each contacting the semiconductor active layer; a plurality of pixel electrodes on the at least one thin film transistor; a plurality of organic layers on the plurality of the pixel electrodes; and a counter electrode located on the plurality of organic layers. A length of a slanted side between top and bottom sides of at least one of the plurality of organic layers on the substrate farther from a center of a deposition region is larger than lengths of slanted sides between respective top and bottom sides of other ones of the plurality of organic layers formed closer to the center of the deposition region, and the at least one of the plurality of organic layers on the substrate is a linearly-patterned organic layer formed using an organic layer deposition apparatus described above.

The substrate may have a size of 40 inches or more.

The plurality of organic layers may include at least an emission layer.

The plurality of organic layers may have a non-uniform thickness.

In each of the organic layers formed farther from the center of the deposition region, the slanted side farther from the center of the deposition region may be larger than the other slanted side.

The further one of the plurality of organic layers in the deposition region is from the center of the deposition region, the narrower an overlapped region of two sides of the one of the plurality of organic layers may be formed.

The slanted sides of the organic layer disposed at the center of the deposition region may have substantially the same length.

The plurality of organic layers in the deposition region may be symmetrically arranged about the center of the deposition region.

According to another embodiment of the present invention, there is provided an apparatus for organic layer deposition including a conveyer unit including a transfer unit on which a substrate is fixed to move therewith; a first conveyer unit, which moves the transfer unit on which the substrate is fixed in a first direction; and a second conveyer unit, which moves the transfer unit from which the substrate is detached after deposition in a direction opposite to the first direction; and a deposition unit including a chamber maintained at a vacuum; and one or more organic layer deposition assemblies which deposit organic material layers on the substrate fixed to the transfer unit, wherein the organic layer deposition assembly includes a deposition source, which emits a deposition material; a deposition source nozzle unit, which is arranged on one side of the deposition source, the deposition source nozzle unit including a plurality of deposition source nozzles; a patterning slit sheet, which is arranged to face the deposition source nozzle unit, the patterning slit sheet including a plurality of patterning slits arranged in a direction; and a first tooling shutter, which is arranged between the deposition source and the patterning slit sheet to cover at least a portion of the substrate, the first tooling shutter including one or more tooling slits formed in the first direction, wherein the transfer unit is able to move back and forth between the first conveyer unit and the second conveyer unit, and the substrate that is fixed to the transfer unit is a set distance apart from the organic layer deposition assemblies while being transported by the first conveyer unit.

The first tooling shutter may be arranged at each of the plurality of organic layer deposition assemblies, and the tooling slits formed in each of the first tooling shutters may be formed to be offset to one another.

The first tooling shutter may be arranged at the organic layer deposition assembly for depositing a common layer, among the plurality of organic layer deposition assemblies.

In one embodiment, the first tooling shutter is arranged to cover at least a portion of the substrate only when the substrate for tooling is transported in the deposition unit.

In the organic layer deposition assembly for depositing a pattern layer according to one embodiment, among the plurality of organic layer deposition assemblies, a second tooling shutter, which is arranged between the deposition source and the patterning slit sheet to cover at least a portion of the substrate and including tooling slits at two opposite ends along the first direction, is further formed.

A width of the tooling slit of the second tooling shutter may be greater than a width of the patterning slit of the patterning slit sheet.

In one embodiment, the first conveyer unit and the second conveyer unit are arranged to pass through the deposition unit.

In one embodiment, the first conveyer unit and the second conveyer unit are arranged next to each other in a vertical direction.

In one embodiment, the apparatus further includes a loading unit in which the substrate is fixed to the transfer unit; and an unloading unit in which the substrate is detached from the transfer unit after the substrate passes through the deposition unit and deposition thereon is completed.

In one embodiment, the first conveyer unit moves the transfer unit to the loading unit, the deposition unit, and the unloading unit in the order stated.

In one embodiment, the second conveyer unit moves the transfer unit to the unloading unit, the deposition unit, and the loading unit in the order stated In the organic layer deposition assemblies according to one embodiment, the deposition material emitted by the deposition source passes through the patterning slit sheet and is deposited to form a pattern on the substrate.

In one embodiment, the patterning slit sheet of the organic layer deposition assemblies is smaller than the substrate.

In one embodiment, a magnetic rail is formed in a surface of the transfer unit, a plurality of coils are formed at each of the first conveyer unit and the second conveyer unit, and the magnetic rail and the coils are combined with each other and constitute a driving unit which generates driving power for moving the transfer unit.

In one embodiment, the plurality of deposition source nozzles are formed at the deposition source nozzle unit in the first direction, and the plurality of patterning slits are formed at the patterning slit sheet in the first direction. The apparatus further includes a shielding plate assembly, which includes a plurality of shielding plates that are arranged between the deposition source nozzle unit and the patterning slit sheet in the first direction and defines the space between the deposition source nozzle unit and the patterning slit sheet into a plurality of deposition spaces.

In one embodiment, each of the plurality of shielding plates extends in a second direction substantially perpendicular to the first direction.

In one embodiment, the shielding plate assembly includes a first shielding plate assembly including a plurality of first shielding plates; and a second shielding plate assembly including a plurality of second shielding plates.

In one embodiment, the plurality of deposition source nozzles are formed at the deposition source nozzle unit in the first direction, and the plurality of patterning slits are formed at the patterning slit sheet in a second direction perpendicular to the first direction.

In one embodiment, the deposition source, the deposition source nozzle unit, and the patterning slit sheet are connected to one another via a connecting member and are formed as a single body.

In one embodiment, the connecting member guides a path in which the deposition material moves.

In one embodiment, the connecting member is formed to seal a space formed by the deposition source, the deposition source nozzle unit, and the patterning slit from outside.

According to another embodiment of the present invention, there is provided a method of using the apparatus for organic layer deposition for forming an organic material layer on a substrate, the method including an operation in which, while a substrate is fixed to a transfer unit, the transfer unit is transported into a chamber by a first conveyer unit that is configured to pass through the chamber; an operation in which, when a plurality of organic layer deposition assemblies are a set or predetermined distance apart from the substrate, the substrate moves relative to the organic layer deposition assemblies and organic material layers are formed as deposition materials emitted by the organic layer deposition assemblies are deposited on the substrate; and an operation in which the transfer unit from which the substrate is detached is transported back by a second conveyer unit that is configured to pass through the chamber, wherein the operation in which the organic material layer is formed includes an operation in which, while a substrate for tooling is being transported in the organic layer deposition assemblies, the deposition material is deposited onto the tooling substrate by a first tooling shutter in which one or more tooling slits are formed.

In one embodiment, the first tooling shutter is arranged in each of the plurality of organic layer deposition assemblies, and the tooling slits formed in the first tooling shutters are formed to be somewhat offset to one another.

In one embodiment, the first tooling shutter is arranged in an organic layer deposition assembly for depositing a common layer, among the plurality of organic layer deposition assemblies.

In one embodiment, the first tooling shutter is arranged to cover at least a portion of the substrate only while the tooling substrate is being transported in the organic layer deposition assemblies.

In one embodiment, the method further includes an operation in which the substrate is fixed to the transfer unit at the loading unit before the transfer unit is transported by the first conveyer unit; and an operation in which the substrate, to which deposition is completed, is detached from the transfer unit at the unloading unit before the transfer unit is transported back by the second conveyer unit.

In one embodiment, the transfer unit moves back and forth between the first conveyer unit and the second conveyer unit.

In one embodiment, the first conveyer unit and the second conveyer unit are arranged next to each other in a vertical direction.

In one embodiment, each of the organic layer deposition assemblies includes a deposition source, which emits a deposition material; a deposition source nozzle unit, which is arranged at one side of the deposition source, the deposition source nozzle unit including a plurality of deposition source nozzles; a patterning slit sheet, which is arranged to face the deposition source nozzle unit, the patterning slit sheet including a plurality of patterning slits arranged in a direction, and the deposition material emitted by the deposition source passes through the patterning slit sheet and is deposited to form a pattern on the substrate.

In an organic layer deposition assembly for depositing a pattern layer among the plurality of organic layer deposition assemblies according to one embodiment, a second tooling shutter, which is arranged between the deposition nozzle and the patterning slit sheet to cover at least a portion of the substrate and includes tooling slits formed at two opposite ends, is formed.

In one embodiment, a width of the tooling slit of the second tooling shutter is greater than a width of the patterning slit of the patterning slit sheet.

In one embodiment, the patterning slit sheet of the organic layer deposition assembly is formed smaller than the substrate in at least any one of the first direction and the second direction perpendicular to the first direction.

According to another embodiment of the present invention, there is provided an organic light-emitting display device including a substrate; at least one thin film transistor that is disposed on the substrate and includes a semiconductor active layer, a gate electrode insulated from the semiconductor active layer, and source and drain electrodes each contacting the semiconductor active layer; a plurality of pixel electrodes disposed on the at least one thin film transistor; a plurality of organic layers disposed on the plurality of the pixel electrodes; and a counter electrode disposed on the plurality of organic layers, wherein a length of a slanted side between top and bottom sides of at least one of the plurality of organic layers formed on the substrate farther from a center of a deposition region is larger than slated sides between respective top and bottom sides of the other organic layers formed closer to the center of the deposition region, wherein the at least one of the plurality of organic layers formed on the substrate is a linearly-patterned organic layer formed using the organic layer deposition apparatus above.

In one embodiment, the substrate has a size of 40 inches or more.

In one embodiment, the plurality of organic layers include at least an emission layer.

In one embodiment, the plurality of organic layers have a non-uniform thickness.

According to one embodiment, in each of the organic layers formed farther from the center of the deposition region, the slanted side farther from the center of the deposition region is larger than the other slanted sides.

In one embodiment, the further one of the plurality of organic layers formed in the deposition region is from the center of the deposition region, the narrower an overlapped region of two sides of the one of the plurality of organic layers is formed.

In one embodiment, hypotenuses of the organic layer disposed at the center of the deposition region have substantially the same length.

In one embodiment, the plurality of organic layers disposed in the deposition region are symmetrically arranged about the center of the deposition region.

BRIEF DESCRIPTION OF THE DRAWINGS

The above and other features and aspects of the present invention will become more apparent by describing in detail embodiments thereof with reference to the attached drawings in which.

DETAILED DESCRIPTION

Figure 1:
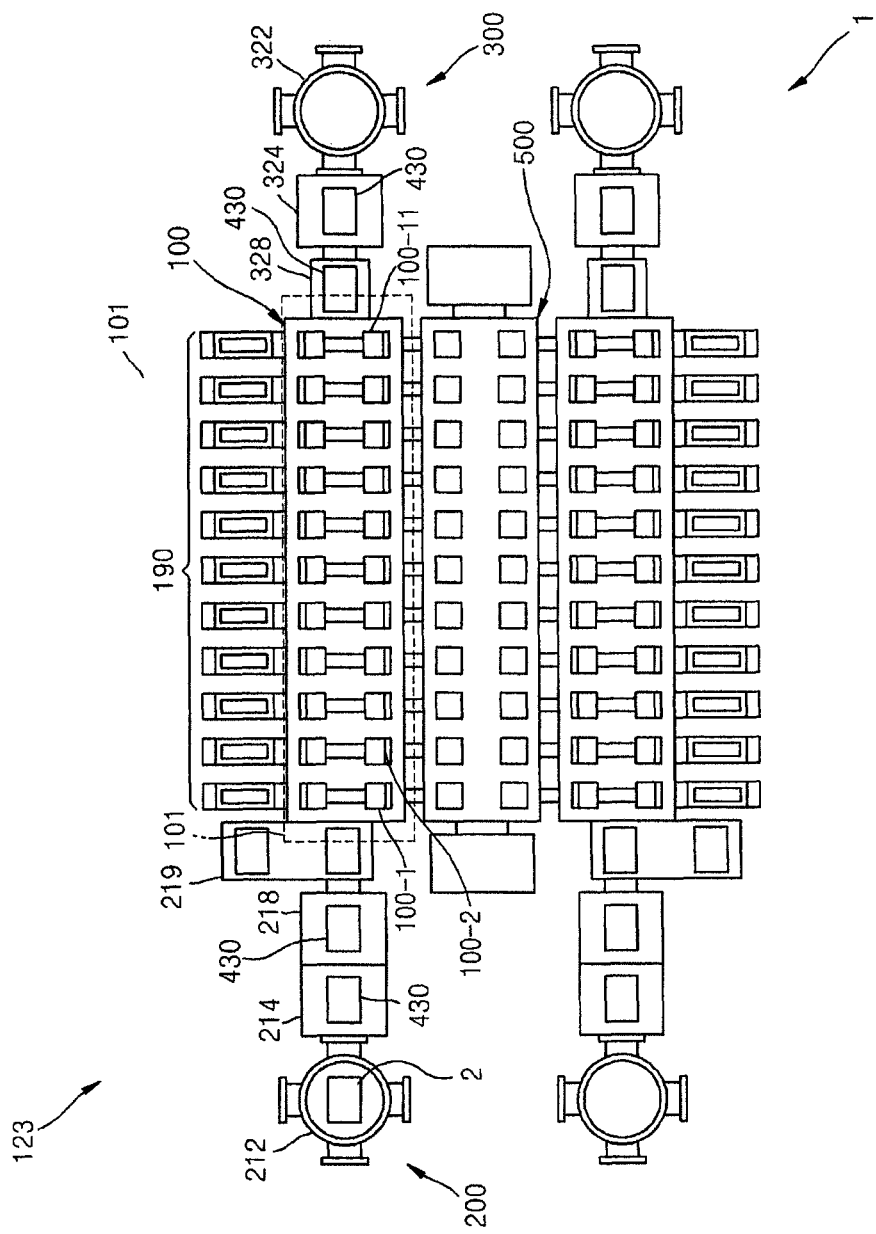
FIG. 1 is a schematic plan view illustrating a structure of an organic layer deposition apparatus according to an embodiment of the present invention.

As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments of the present invention, examples of which are illustrated in the accompanying drawings, wherein like reference numerals refer to like elements throughout. The embodiments are described below in order to explain aspects of the present invention by referring to the figures.

Figure 2:
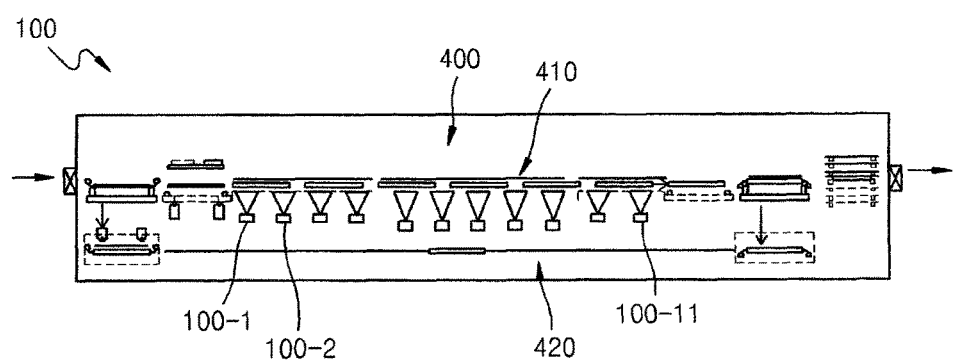
FIG. 2 is a schematic side view of a deposition unit of the organic layer deposition apparatus of FIG. 1, according to an embodiment of the present invention.

FIG. 1 is a schematic plan view illustrating a structure of an organic layer deposition apparatus 1 according to an embodiment of the present invention. FIG. 2 is a schematic side view of a deposition unit 100 of the organic layer deposition apparatus 1 of FIG. 1, according to an embodiment of the present invention.

Figure 3:
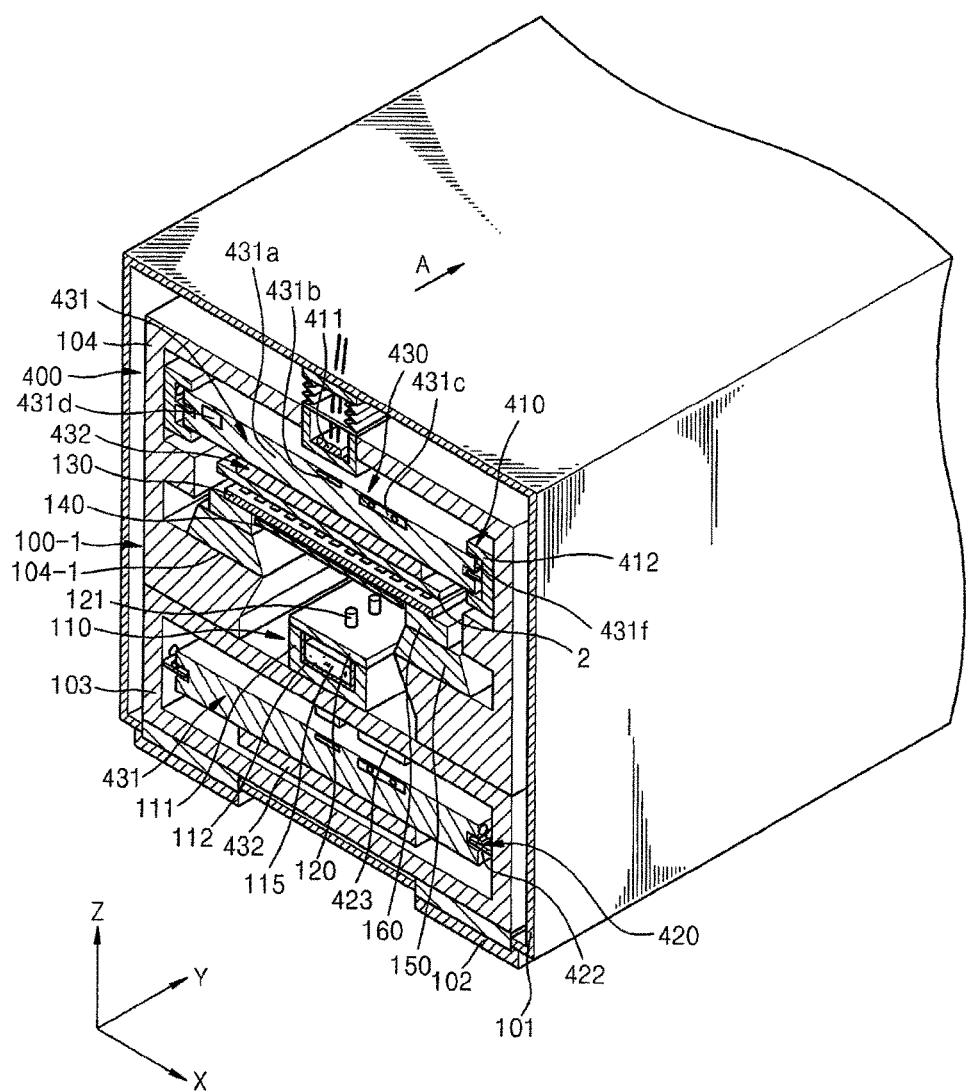
FIG. 3 is a schematic perspective view of the deposition unit of the organic layer deposition apparatus of FIG. 1, according to an embodiment of the present invention.
Figure 4:
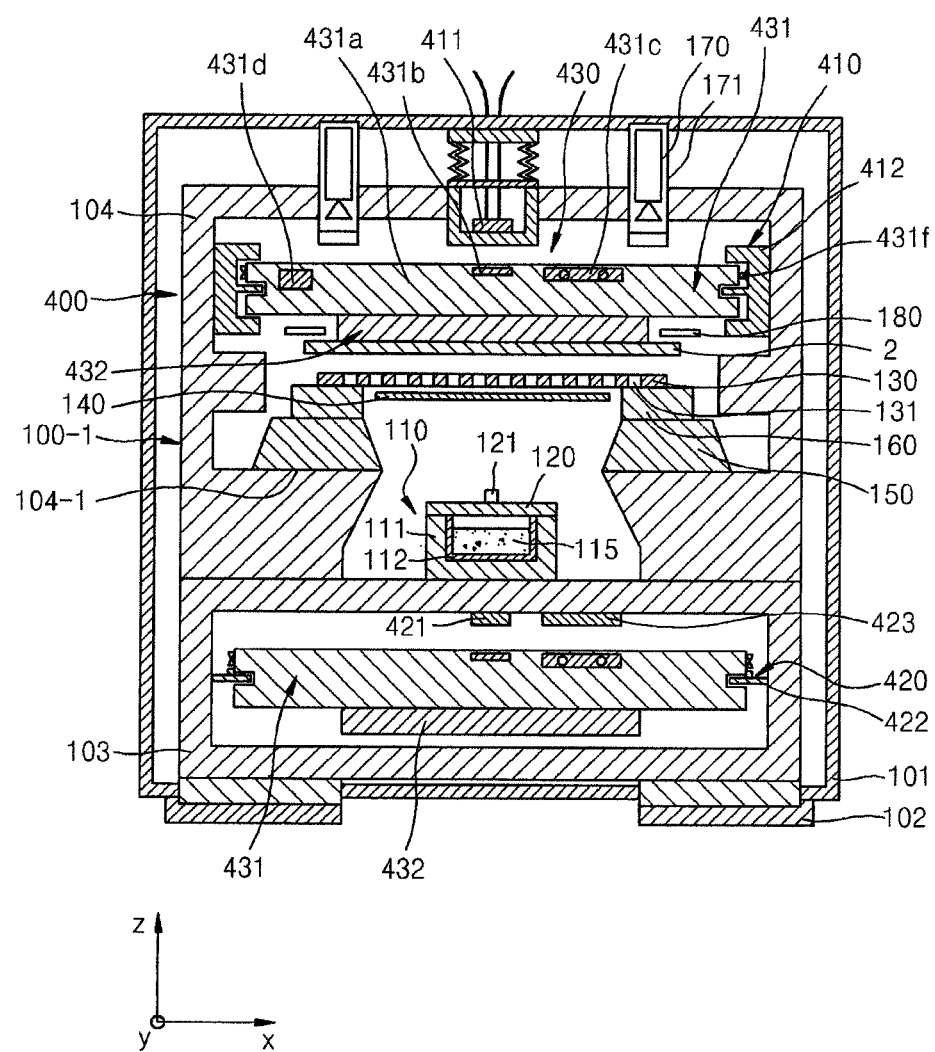
FIG. 4 is a schematic cross-sectional view of the deposition unit of FIG. 3, according to an embodiment of the present invention.

Referring to FIGS. 1 and 2, the organic layer deposition apparatus 1 includes the deposition unit 100, a loading unit 200, an unloading unit 300, and a conveyer unit 400 (refer to FIGS. 3 and 4).

The loading unit 200 may include a first rack 212, a transport chamber 214, a first inversion chamber 218, and a buffer chamber 219.

A plurality of substrates 2 (for example, one substrate 2 is shown in FIGS. 3 and 4) onto which a deposition material has not yet been applied are stacked up on the first rack 212. A transport robot included in the transport chamber 214 picks up one of the substrates 2 from the first rack 212, places the substrate 2 on a transfer unit 430 transferred by a second conveyer unit 420, and moves the transfer unit 430, on which the substrate 2 is placed, into the first inversion chamber 218.

The first inversion chamber 218 is located adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430, on which the substrate 2 is placed, is then transferred into the first inversion chamber 218. The first inversion robot of the first inversion chamber 218 inverts the transfer unit 430 so that the substrate 2 is turned upside down in the deposition unit 100.

The unloading unit 300 is configured to operate in an opposite manner to the loading unit 200 described above. For example, a second inversion robot in a second inversion chamber 328 inverts the substrate 2 and the transfer unit 430, which have passed through the deposition unit 100, and then moves the substrate 2 and the transfer unit 430 to an ejection chamber 324. Then, an ejection robot takes the substrate 2 and the transfer unit 430 out of the ejection chamber 324, separates the substrate 2 from the transfer unit 430, and then loads the substrate 2 on a second rack 322. The transfer unit 430, from which the substrate 2 is separated, is returned to the loading unit 200 via the second conveyer unit 420.

However, the present invention is not limited to the above example. For example, when placing the substrate 2 on the transfer unit 430, the substrate 2 may be fixed (or attached) onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies (100-1), (100-2) through (100-n) may be located. Referring to FIG. 1, 11 organic layer deposition assemblies, i.e., an organic layer deposition assembly (100-1), an organic layer deposition assembly (100-2), through an organic layer deposition assembly (100-11), are located in the chamber 101, but the number of organic layer deposition assemblies may vary with a desired deposition material and deposition conditions. The chamber 101 is maintained in vacuum during the deposition process. According to an embodiment of the present invention, the organic layer deposition assemblies (For example, see 100-1, 100-2, through 100-11 of FIG. 7) may include a plurality of common layer deposition assemblies (100-1, 100-2, 100-3, 100-4, 100-10, and 100-11 of FIG. 7) for forming common layers and a plurality of pattern layer deposition assemblies (100-5, 100-6, 100-7, 100-8, and 100-9 of FIG. 7) for forming the pattern layers This will be described later.

In the embodiment illustrated in FIG. 1, the transfer unit 430 with the substrate 2 fixed thereon (or attached thereto) may be moved at least to the deposition unit 100 or may be moved sequentially to the loading unit 200, the deposition unit 100, and the unloading unit 300, by the first conveyer unit 410, and the transfer unit 430 from which the substrate 2 is separated in the unloading unit 300 may be moved back to the loading unit 200 by the second conveyer unit 420.

The first conveyer unit 410 passes through the chamber 101 when passing through the deposition unit 100, and the second conveyer unit 420 conveys (or transports) the transfer unit 430 from which the substrate 2 is separated.

In the present embodiment, the organic layer deposition apparatus 1 is configured such that the first conveyer unit 410 and the second conveyer unit 420 are respectively disposed above and below so that after the substrate 2 is separated from the transfer unit 430, on which deposition has been completed while passing through the first conveyer unit 410, the transfer unit 430 is returned to the loading unit 200 via the second conveyer unit 420 formed below the first conveyer unit 410, and thus, the organic layer deposition apparatus 1 may have an improved space utilization efficiency. In other words, the first and second conveyer units 410 and 420 are arranged in parallel, one on top of the other.

In an embodiment, the deposition unit 100 illustrated in FIG. 1 may further include a deposition source replacement unit 190 located at a side of each organic layer deposition assembly 100-n. Although not particularly illustrated in the drawings, the deposition source replacement unit 190 may be formed as a cassette-type that may be drawn to the outside from each organic layer deposition assembly. Thus, a deposition source 110 (refer to FIG. 3) of the organic layer deposition assembly 100-1 may be replaced with relative ease.

FIG. 1 illustrates the organic layer deposition apparatus 1 in which two sets of structures each including the loading unit 200, the deposition unit 100, the unloading unit 300, and the conveyer unit 400 are arranged in parallel. That is, it is seen that two organic layer deposition apparatuses 1 are respectively arranged side-by-side (above and below in FIG. 1). In such an embodiment, a patterning slit sheet replacement unit 500 may be further located between the two organic layer deposition apparatuses 1. That is, due to this configuration of structures, the two organic layer deposition apparatuses 1 share the patterning slit sheet replacement unit 500, resulting in improved space utilization efficiency, as compared to a case where each organic layer deposition apparatus 1 includes a patterning slit sheet replacement unit 500.

FIG. 3 is a schematic perspective view of the deposition unit 100 of the organic layer deposition apparatus 1 of FIG. 1, according to an embodiment of the present invention. FIG. 4 is a schematic cross-sectional view of the deposition unit 100 of FIG. 3, according to an embodiment of the present invention.

Referring to FIGS. 3 and 4, the deposition unit 100 of the organic layer deposition apparatus 1 includes at least one organic layer deposition assembly 100-1 and the conveyer unit 400.

Hereinafter, an overall structure of the deposition unit 100 will be described.

The chamber 101 may be formed as a hollow box type and may include the at least one organic layer deposition assembly 100-1 and the conveyer unit 400. A foot 102 is formed so as to fix the deposition unit 100 on the ground, a lower housing 103 is located on the foot 102, and an upper housing 104 is located on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are located on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in detail.

The organic layer deposition assembly 100-1 includes the deposition source 110, a deposition source nozzle unit 120, a patterning slit sheet 130, a shielding member 140, a first stage 150, a second stage 160, a camera(s) 170, and a sensor(s) 180. In this regard, all the elements illustrated in FIGS. 3 and 4 may be arranged in the chamber 101 maintained in an appropriate vacuum state. This structure is used to achieve the linearity of a deposition material.

For example, in order to deposit a deposition material 115 that has been discharged from the deposition source 110 and passed through the deposition source nozzle unit 120 and the patterning slit sheet 130, onto the substrate 2 in a desired pattern, it is desirable to maintain the vacuum state of the chamber (not shown) at high levels as those used in a fine metal mask (FMM) deposition method. In addition, the temperature of the patterning slit sheet 130 should be sufficiently lower than that of the deposition source 110 because thermal expansion of the patterning slit sheet 130 is reduced or minimized when the temperature of the patterning slit sheet 130 is sufficiently low.

The substrate 2, on which the deposition material 115 is to be deposited, is arranged in the chamber 101. The substrate 2 may be a substrate for a flat panel display apparatus (device). For example, a large substrate, such as a mother glass, for manufacturing a plurality of flat panel displays, may be used as the substrate 2.

According to the present embodiment, the deposition process may be performed by moving the substrate 2 relative to the organic layer deposition assembly 100-1.

In a conventional deposition method using an FMM, the size of the FMM is the same as that of a substrate. Thus, as the size of the substrate increases, the size of the FMM also increases. Due to these problems, it is difficult to fabricate the FMM and to align the FMM in a precise pattern by elongating the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as moving in the Y-axis direction in the chamber 101 in FIG. 3 when deposition is performed, the present invention is not limited thereto. For example, deposition may be performed while the substrate 2 is fixed and the organic layer deposition assembly 100-1 is moved in the Y-axis direction.

Thus, in the organic layer deposition assembly 100-1, the patterning slit sheet 130 may be smaller (e.g., much smaller) than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be less (e.g., much less) than a length of the substrate 2 in the same direction. Because the patterning slit sheet 130 may be formed smaller (e.g., much smaller) than the FMM used in a conventional deposition method, it is relatively easy to manufacture the patterning slit sheet 130. That is, the small patterning slit sheet 130 is more suitable in view of the manufacturing processes, including etching, and precise elongation, welding, transferring, and washing processes which are performed after the etching, than the FMM used in a conventional deposition method. In addition, this is more suitable for manufacturing a relatively large display apparatus (device).

In order to perform deposition while the organic layer deposition assembly 100-1 and the substrate 2 are moved relative to each other as described above, the organic layer deposition assembly 100-1 and the substrate 2 may be spaced apart from each other by a certain distance (e.g., a gap). This is described below in more detail.

The deposition source 110 that contains and heats the deposition material 115 is located facing the substrate 2 in the chamber 101. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111, in particular, toward the deposition source nozzle unit 120.

The deposition source nozzle unit 120, in one embodiment, is located at a side of the deposition source 110, for example, a side of the deposition source 110 toward (or facing) the substrate 2. In this regard, the organic layer deposition assemblies according to the present embodiment may each include different deposition nozzles for performing deposition for forming common layers and pattern layers. That is, a deposition source nozzle unit 120 for forming pattern layers may include a plurality of deposition source nozzles 121 arranged along the Y-axis direction, that is, a scanning direction of the substrate 2. Accordingly, along the X-axis direction, only one deposition source nozzle 121 is formed and thus shadows are substantially reduced. A source nozzle unit for forming common layers may include a plurality of deposition source nozzles 121 arranged along the X-axis direction, whereby a thickness uniformity of the common layers may be improved.

In one embodiment, the patterning slit sheet 130 may be located between the deposition source 110 and the substrate 2. The patterning slit sheet 130 may further include a frame having a shape similar to a window frame. The patterning slit sheet 130 includes a plurality of patterning slits 131 arranged in the X-axis direction. The deposition material 115 that has been vaporized in the deposition source 110 passes through the deposition source nozzle unit 120 and the patterning slit sheet 130 and is then moved toward the substrate 2. In this regard, the patterning slit sheet 130 may be formed using the same method as that used to form an FMM, in particular, a stripe-type mask. For example, the patterning slit sheet 130 may be formed by etching. In this regard, a total number of patterning slits 131 may be more than a total number of deposition source nozzles 121.

In one embodiment, the deposition source 110 (and the deposition source nozzle unit 120 combined thereto) and the patterning slit sheet 130 may be spaced apart from each other by a certain distance (e.g., a gap).

As described above, deposition is performed while the organic layer deposition assembly 100-1 is moved relative to the substrate 2. In order for the organic layer deposition assembly 100-1 to be moved relative to the substrate 2, the patterning slit sheet 130 is spaced apart from the substrate 2 by a certain distance (e.g., a gap).

In a conventional deposition method using an FMM, deposition is typically performed with the FMM in close contact with a substrate in order to prevent formation of shadows on the substrate. However, when the FMM is formed in close contact with the substrate, defects due to the contact between the substrate and the FMM may occur. In addition, because it is difficult to move the mask with respect to the substrate, the mask and the substrate have the same size. Accordingly, the mask becomes larger as the size of a display device increases. However, it is difficult to form a large mask.

To address these problems, in the organic layer deposition assembly 100-1 according to the present embodiment, the patterning slit sheet 130 is formed spaced apart by a certain distance (e.g., a gap) from the substrate 2 on which a deposition material is to be deposited.

According to the present embodiment, deposition may be performed while a mask formed smaller than a substrate is moved with respect to the substrate, and thus, it is relatively easy to manufacture the mask. In addition, defects due to contact between the substrate and the mask may be avoided. In addition, because it is unnecessary to closely contact the substrate with the mask during a deposition process, a manufacturing speed may be improved.

Hereinafter, particular dispositions of elements of the upper housing 104 will be described.

The deposition source 110 and the deposition source nozzle unit 120 are located at a bottom portion of the upper housing 104. Accommodation portions 104-1 are respectively formed on both sides of the deposition unit 100 and the deposition source nozzle unit 120 to have a protruding shape. The first stage 150, the second stage 160, and the patterning slit sheet 130 are sequentially formed (or located) on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators so as to move in the Z-axis direction with respect to the first stage 150.

The patterning slit sheet 130 is located on the second stage 160. The patterning slit sheet 130 is located on the first stage 150 and the second stage 160 so as to move in the X-axis, Y-axis, and Z-axis directions, and thus, an alignment, in particular, a real-time alignment, between the substrate 2 and the patterning slit sheet 130, may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be located between the patterning slit sheet 130 and the deposition source 110. In particular, an anode or cathode pattern is formed on an edge portion of the substrate 2 and is used as a terminal for inspecting a product or in manufacturing a product. If an organic material is applied on this edge portion (i.e., the portion on which the anode or cathode pattern is formed) of the substrate 2, the anode or the cathode cannot sufficiently perform its function. Thus, the edge portion of the substrate 2 is formed to be a non-film-forming region on which an organic material or the like is not applied. As described above, however, in the organic layer deposition apparatus, deposition is performed in a scanning manner while the substrate 2 is moved relative to the organic layer deposition apparatus, and thus, it is not easy to prevent the organic material from being deposited on the non-film-forming region of the substrate 2.

Therefore, to prevent the organic material from being deposited on the non-film-forming region of the substrate 2, in the organic layer deposition apparatus, the shielding member 140 may be located at the edge portion of the substrate 2. Although not particularly illustrated in FIGS. 3 and 4, the shielding member 140 may include two adjacent plates.

When the substrate 2 does not pass through the organic layer deposition assembly 100-1, the shielding member 140 screens the deposition source 110, and thus, the deposition material 115 discharged from the deposition source 110 does not reach the patterning slit sheet 130. When the substrate 2 enters into the organic layer deposition assembly 100-1 with the shielding member 140 screening the deposition source 110, a front part of the shielding member 140, which screens the deposition source 110, moves along with the movement of the substrate 2, and thus, the flow path of the deposition material 115 is opened and the deposition material 115 discharged from the deposition source 110 passes through the patterning slit sheet 130 and is deposited on the substrate 2. Also, while the substrate 2 is passing through the organic layer deposition assembly 100-1, a rear part of the shielding member 140 moves along with the movement of the substrate 2 to screen the deposition source 110 so that the flow path of the deposition material 115 is closed. Accordingly, the deposition material 115 discharged from the deposition source 110 does not reach the patterning slit sheet 130.

As described above, the non-film-forming region of the substrate 2 is screened by the shielding member 140, and thus, it is easy (or relatively easy) to prevent the organic material from being deposited on the non-film-forming region of the substrate 2 without using a separate structure.

Hereinafter, the conveyer unit 400 that conveys (or transports) the substrate 2, on which the deposition material 115 is to be deposited, is described in more detail. Referring to FIGS. 3 and 4, the conveyer unit 400 includes the first conveyer unit 410, the second conveyer unit 420, and the transfer unit 430.

The first conveyer unit 410 conveys (or transports) in an in-line manner the transfer unit 430 and the substrate 2 attached to the transfer unit 430 so that an organic layer may be formed on the substrate 2 by the organic layer deposition assembly 100-1, wherein the transfer unit 430 includes a carrier 431 and an electrostatic chuck 432 attached thereto. The first conveyer unit 410 includes a coil 411, guide members 412, upper magnetically suspended (e.g., magnetic levitation or magnetically levitating) bearings (not shown), side magnetically suspended (e.g., magnetic levitation or magnetically levitating) bearings (not shown), and gap sensors (not shown). In one embodiment, the magnetic levitation bearings and the gap sensors are mounted on the guide members 412.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed (or transported) along the first conveyer unit 410 and the second conveyer unit 420 and the electrostatic chuck 432 that is combined on (or attached to) a surface of the carrier 431. The substrate 2 is attached to the electrostatic chuck 432.

Hereinafter, each element of the conveyer unit 400 will be described in more detail.

The carrier 431 of the transfer unit 430 will now be described in detail.

Figure 7:
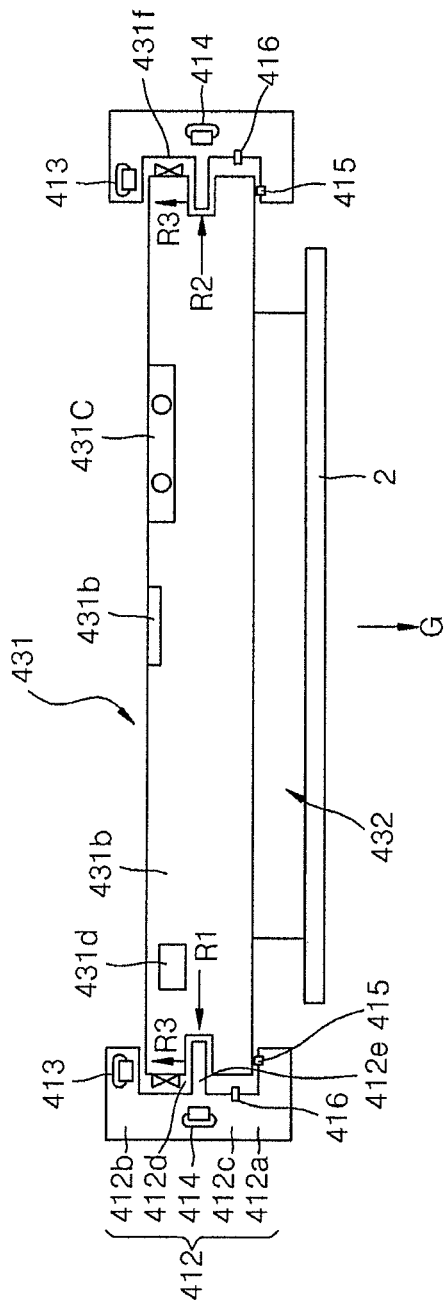
FIG. 7 is a schematic cross-sectional view of a first conveyer unit and a transfer unit of the deposition unit of FIG. 3 according to an embodiment of the present invention.

Referring to FIG. 7, the carrier 431 includes a main body part 431a, a magnetic rail (e.g., a linear motor system (LMS) magnet) 431b, contactless power supply (CPS) modules 431c, a power supply unit 431d, and guide grooves. The carrier 431 may further include cam followers 431f.

The main body part 431a constitutes a base part of the carrier 431 and may be formed of a magnetic material, such as iron. In this regard, due to a repulsive force (and/or an attractive force) between the main body part 431a of the carrier 431 and upper and side magnetically suspended bearings (e.g., magnetic levitation bearings) 413 and 414, which are described below, the carrier 431 may be maintained spaced apart from the guide members 412 by a certain distance (e.g., a gap).

The guide grooves may be respectively formed at both sides of the main body part 431a and each may accommodate a guide protrusion 412e of the guide member 412.

The magnetic rail 431b may be formed along a center line of the main body part 431a in a direction where the main body part 431a proceeds. The magnetic rail 431b of the main body part 431a, and the coil 411, which are described below in more detail, may be combined with each other to constitute a linear motor, and the carrier 431 may be conveyed (or transported) in an arrow A direction by the linear motor.

The CPS modules 431c and the power supply unit 431d may be respectively formed on both sides of the magnetic rail 431b in the main body part 431a. The power supply unit 431d includes a battery (e.g., a rechargeable battery) that provides power so that the electrostatic chuck 432 can chuck (e.g., fix or hold) the substrate 2 and maintains operation. The CPS modules 431c are wireless charging modules that charge the power supply unit 431d. For example, the charging track 423 formed in the second conveyer unit 420, which is described below, is connected to an inverter (not shown), and thus, when the carrier 431 is transferred into the second conveyer unit 420, a magnetic field is formed between the charging track 423 and the CPS modules 431c so as to supply power to the CPS modules 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of a main body of the electrostatic chuck 432 as a high voltage (e.g., a suitable voltage or a relatively high voltage) is applied to the electrode.

Hereinafter, the transfer unit 430 is described in detail.

The magnetic rail 431b of the main body part 431a and the coil 411 may be combined with each other to constitute an operation unit. In this regard, the operation unit may be a linear motor. The linear motor has a high degree (e.g., very high degree) of position determination due to its small frictional coefficient and little position error, as compared to a conventional slide guide system. As described above, the linear motor may include the coil 411 and the magnetic rail 431b. The magnetic rail 431b is linearly located on the carrier 431, and a plurality of the coils 411 may be located at an inner side of the chamber 101 and separated from the magnetic rail 431b by a certain distance (e.g., a gap) so as to face the magnetic rail 431b. Because the magnetic rail 431b is located at the carrier 431 instead of the coil 411, the carrier 431 may be operable without power being supplied thereto. In this regard, the coil 411 may be formed (or located) in an atmosphere (ATM) box in an air atmosphere, and the carrier 431 to which the magnetic rail 431b is attached may be moved in the chamber 101 maintained in vacuum.

Hereinafter, the first conveyer unit 410 and the transfer unit 430 are described in detail.

Referring to FIGS. 4 and 7, the first conveyer unit 410 conveys (or transports) the electrostatic chuck 432 that fixes (or attaches to) the substrate 2 and the carrier 431 that conveys (or transports) the electrostatic chuck 432. In this regard, the first conveyer unit 410 includes the coil 411, the guide members 412, the upper magnetically suspended (e.g., magnetic levitation) bearings 413, the side magnetically suspended (e.g., magnetic levitation) bearings 414, and the gap sensors 415 and 416.

The coil 411 and the guide members 412 are formed (or located) inside the upper housing 104. The coil 411 is formed (or located) in an upper portion of the upper housing 104, and the guide members 412 are respectively formed on (or located at) both inner sides of the upper housing 104.

The guide members 412 guide the carrier 431 to move in a direction. In this regard, the guide members 412 are formed to pass through the deposition unit 100.

In particular, the guide members 412 accommodate both sides of the carrier 431 to guide the carrier 431 to move along in the direction of arrow A illustrated in FIG. 3. In this regard, the guide member 412 may include a first accommodation part 412a disposed below the carrier 431, a second accommodation part 412b disposed above the carrier 431, and a connection part 412c that connects the first accommodation part 412a and the second accommodation part 412b. An accommodation groove 412d is formed by the first accommodation part 412a, the second accommodation part 412b, and the connection part 412c. Both sides of the carrier 431 are respectively accommodated in the accommodation grooves 412d, and the carrier 431 is moved along the accommodation grooves 412d.

The side magnetically suspended (e.g., magnetic levitation) bearings 414 are each located at (or in) the connection part 412c of the guide member 412 so as to respectively correspond to both sides of the carrier 431. The side magnetically suspended (e.g., magnetic levitation) bearings 414 form (or cause) a distance between the carrier 431 and the guide member 412 so that the carrier 431 is moved along the guide members 412 in non-contact with the guide members 412. That is, a repulsive force R1 occurring between the side magnetically suspended (e.g., magnetic levitation) bearing 414 on the left side of FIG. 7 and the carrier 431, which is a magnetic material, and a repulsive force R2 occurring between the side magnetically suspended (e.g., magnetic levitation) bearing 414 on the right side in FIG. 7 and the carrier 431, which is a magnetic material, maintain equilibrium, and thus, there is a constant (or substantially constant) distance between the carrier 431 and the respective parts of the guide member 412.

Each upper magnetically suspended (e.g., magnetic levitation) bearing 413 may be located at (or in) the second accommodation part 412b of the guide member 412 so as to be above the carrier 431. The upper magnetically suspended (e.g., magnetic levitation) bearings 413 enable the carrier 431 to be moved along the guide members 412 in non-contact with the first and second accommodation parts 412a and 412b and with a distance (or a gap) therebetween maintained constant (or substantially constant). That is, a repulsive force (or alternatively an attractive force) R3 occurring between the upper magnetically suspended bearing 413 and the carrier 431, which is a magnetic material, and gravity G maintain equilibrium, and thus, there is a constant (or substantially constant) distance between the carrier 431 and the respective guide members 412.

Each guide member 412 may further include gap sensors 415 and 416. The gap sensors 415 and 416 may measure a distance between the carrier 431 and the guide member 412. Referring to FIG. 7, the gap sensor 415 may be disposed in the first accommodation part 412a so as to correspond to a bottom portion of the carrier 431. The gap sensor 415 disposed in the first accommodation part 412a may measure a distance between the first accommodation part 412a and the carrier 431. The gap sensor 416 may be disposed at a side of the side magnetically suspended bearing 414. The gap sensor 416 may measure a distance between a side surface of the carrier 431 and the side magnetically suspended bearing 414. The present invention is not limited to the above example and the gap sensor 416 may be disposed in the connection part 412c.

Magnetic forces of the upper and side magnetically suspended (e.g., magnetic levitation) bearings 413 and 414 may vary according to values measured by the gap sensors 415 and 416, and thus, distances between the carrier 431 and the respective guide members 412 may be adjusted in real time. That is, a precise transfer of the carrier 431 may be feedback controlled using the upper and side magnetically suspended (e.g., magnetic levitation) bearings 413 and 414 and the gap sensors 415 and 416.

Hereinafter, the second conveyer unit 420 and the transfer unit 430 are described in detail.

Referring back to FIG. 4, the second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

In particular, the coil 421, the roller guides 422, and the charging track 423 may be positioned at an inner surface of the lower housing 103. For example, the coil 421 and the charging track 423 may be located at a top inner surface of the lower housing 103, and the roller guides 422 may be located at both inner sides of the lower housing 103. In this regard, like the coil 411 of the first conveyer unit 410, the coil 421 may be located in an ATM box.

Also, like the first conveyer unit 410, the second conveyer unit 420 also includes the coil 421, and the coil 421 may be combined with the magnetic rail 431b of the main body part 431a of the carrier 431 to constitute a driving unit, and herein the driving unit may be a linear motor. The carrier 431 may be moved by the linear motor along a direction opposite to the direction of arrow A illustrated in FIG. 3.

The roller guides 422 guide the carrier 431 to move in a direction. In this regard, the roller guides 422 are formed (e.g., located or arranged) to pass through the deposition unit 100. In particular, the roller guides 422 support cam followers 431f (see FIG. 7) respectively formed on both sides of the carrier 431 to guide the carrier 431 to move along a direction opposite to the direction of arrow A illustrated in FIG. 3. That is, the carrier 431 is moved with the cam followers 431f disposed on both sides of the carrier 431 respectively rotating along the roller guides 422. In this regard, the cam followers 431f are utilized as bearings used to accurately repeat a particular operation. In an embodiment, a plurality of the cam followers 431f are formed on a side surface of the carrier 431 and serve as a wheel for conveying the carrier 431 in the second conveyer unit 420. A detailed description of the cam followers 431f is not provided herein.

The second conveyer unit 420 is used in a process of returning the carrier 431 from which the substrate 2 has been separated and not in a process of depositing an organic material on the substrate 2, and thus, position accuracy (or positional accuracy) thereof is not as needed as by the first conveyer unit 410. Therefore, magnetic suspension (e.g., magnetic levitation) is applied to the first conveyer unit 410 that requires high position accuracy to thereby obtain position accuracy, and a conventional roller method is applied to the second conveyer unit 420 that requires relatively low position accuracy, thereby reducing manufacturing costs and simplifying a structure of an organic layer deposition apparatus. Although not illustrated in FIG. 4, the magnetic suspension may also be applied to the second conveyer unit 420, as in the first conveyer unit 410.

The organic layer deposition assembly 100-1 of the organic layer deposition apparatus 1 according to the present embodiment may further include cameras 170 and sensors 180 for an aligning process. In detail, the cameras 170 may align in real time a first alignment mark formed in the frame 135 of the patterning slit sheet 130 and a second alignment mark formed on the substrate 2. In this regard, the cameras 170 are positioned for a more accurate view in the chamber 101 maintained in vacuum during deposition. For this, the cameras 170 may be installed in respective camera accommodation units 171 in an atmospheric state.

Because the substrate 2 and the patterning slit sheet 130 are spaced apart from each other by a certain distance (e.g., a gap), distances between the substrate 2 and the patterning slit sheet 130 that are located at different positions are measured using the cameras 170. For this operation, the organic layer deposition assembly 100-1 of the organic layer deposition apparatus 1 may include the sensors 180. In this regard, the sensors 180 may be confocal sensors. The confocal sensors may scan an object to be measured by using laser beams that rotate at a high speed by using a scanning mirror and measure a distance to the object by using fluorescent or reflected rays emitted by the laser beams. The confocal sensors may measure a distance by sensing a boundary interface between different media.

The use of the cameras 170 and the sensors 180 enables real-time measuring of a distance between the substrate 2 and the patterning slit sheet 130 and thus aligning the substrate 2 and the patterning slit sheet 130 in real-time, and thus position accuracy (or positional accuracy) of a pattern may be improved (e.g., significantly improved).

Figure 5:
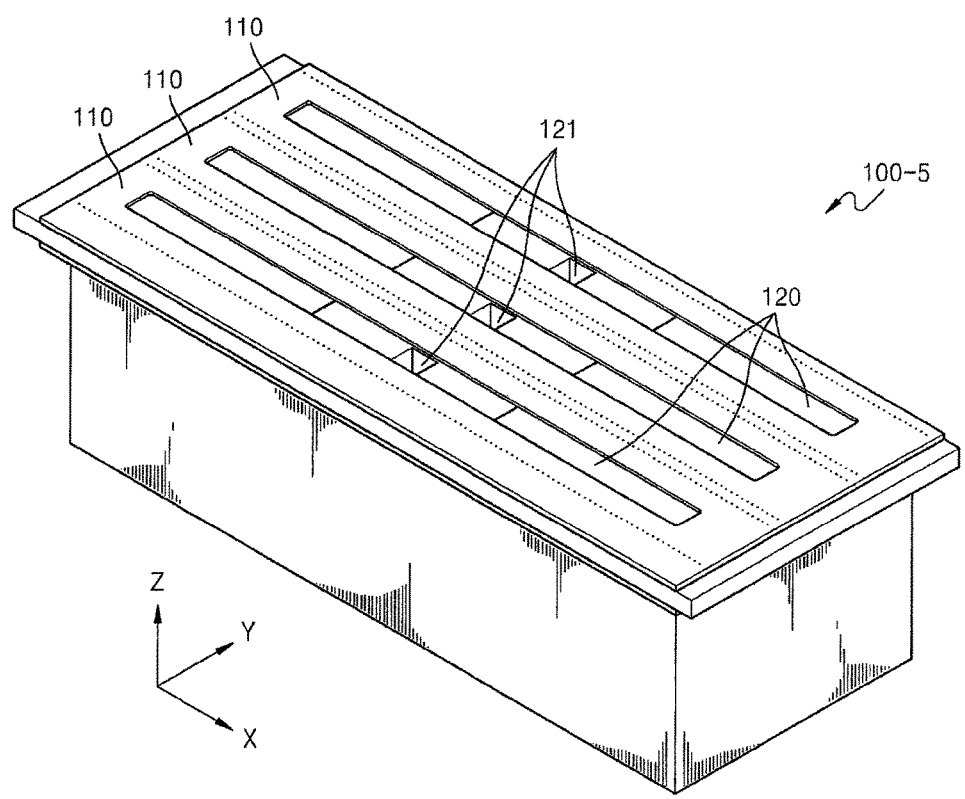
FIG. 5 is a perspective view of a deposition source of the deposition unit of FIG. 3, according to an embodiment of the present invention.
Figure 6:
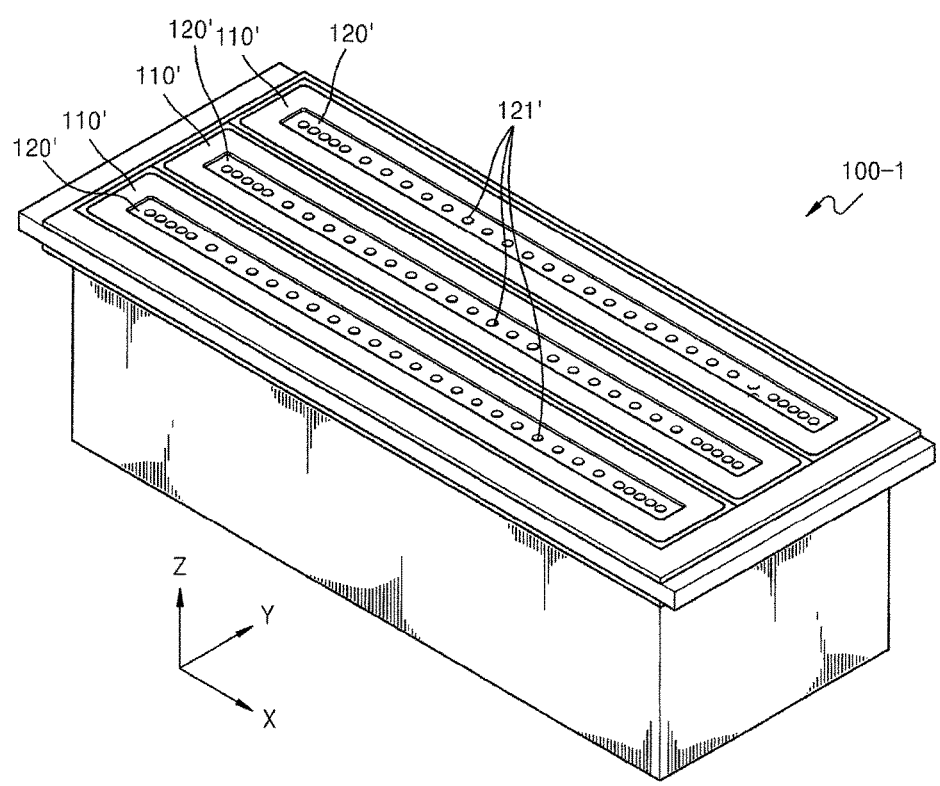
FIG. 6 is a perspective view of a deposition source of the deposition unit of FIG. 3, according to another embodiment of the present invention.

FIG. 5 is a perspective view illustrating deposition source nozzles 121 for forming pattern layers, and FIG. 6 is a perspective view illustrating deposition source nozzles 121' for forming common layers. Organic layer deposition assemblies for forming pattern layers are pattern layer deposition assemblies (for example, see organic layer deposition assemblies 100-5 to 100-9 of FIG. 13) and thus will be referred to as such hereinafter, and organic layer deposition assemblies for forming common layers are common layer deposition assemblies 100-1 to 100-4, 100-10, and 100-11 and thus will be referred to as such hereinafter.

Referring to FIG. 5, the pattern layer deposition assembly 100-5 includes three deposition sources 110 and three deposition source nozzle units 120, and each of the deposition source nozzle units 120 includes one deposition source nozzle 121 at its center. The deposition material 115 that has been vaporized in the deposition source 110 passes through the deposition source nozzle unit 120 and is then moved toward the substrate 2. As described above, each deposition source nozzle unit 120 has one deposition source nozzle 121, and in a single pattern layer deposition assembly 100-5 according to one embodiment, three deposition sources 110 are arranged along a scan direction of the substrate 2, and ultimately, a plurality of deposition source nozzles 121 are arranged along the scan direction of the substrate 2 in the pattern layer deposition assembly 100-5. In this regard, if a plurality of the deposition source nozzles 121 are arranged along the X-axis direction, an interval between each of the deposition source nozzles 121 and the patterning slit 131 may vary and in this case, a shadow may be formed by a deposition material ejected from a deposition source nozzle that is located relatively far from the patterning slit 131. Accordingly, forming only one deposition source nozzle 121 in the X-axis direction as in the present embodiment may contribute to a reduction (e.g., substantial decrease or reduction) in the formation of shadows. In addition, because the deposition source nozzles 121 are arranged along the scan direction, even when a flux difference occurs between individual deposition source nozzles, the flux difference may be offset and thus deposition uniformity may be maintained constant (or substantially constant).

In addition, although not illustrated in FIG. 5, among three deposition sources 110 located in the pattern layer deposition assembly 100-5, deposition sources at opposite ends may be used to deposit a host material and the middle deposition source may be used to deposit a dopant material. As described above, an organic layer deposition apparatus according to an embodiment of the present invention may include both a deposition source for depositing a host material and a deposition source for depositing a dopant material so as to concurrently deposit a host material and a dopant material on the substrate 2, and thus a process is quickly performed and device efficiency may also be improved.

Referring to FIG. 6, a deposition source nozzle unit 120' is located at a side of a deposition source 110', for example, a side of the deposition source 110' facing the substrate 2. In addition, the deposition source nozzle unit 120' includes a plurality of deposition source nozzles 121' arranged along the X-axis direction (that is, a direction perpendicular to the scan direction of the substrate 2). In one embodiment, the deposition source nozzles 121' may be formed equidistant from each other, and according to another embodiment, distances between adjacent deposition source nozzles 121' may decrease toward opposite ends of the deposition source nozzle unit 120'. A deposition material vaporized in the deposition source 110' may pass through the deposition source nozzles 121' of the deposition source nozzle unit 120' to move toward the substrate 2 on which the deposition material is to be deposited. As described above, in forming a common layer, the deposition source nozzles 121' are formed along the X-axis direction (that is, a direction perpendicular to the scan direction of the substrate 2), and thus a thickness uniformity of common layers may be improved.

In one embodiment, the patterning slit sheet 130 may be located between the deposition source 110 and the substrate 2. The patterning slit sheet 130 may further include a frame having a shape similar to a window frame. The patterning slit sheet 130 includes the plurality of patterning slits 131 arranged along the X-axis direction. The deposition material 115 that has been vaporized in the deposition source 110 passes through the deposition source nozzle unit 120 and the patterning slit sheet 130 and is then moved toward the substrate 2. In this regard, the patterning slit sheet 130 may be formed using the same method as that used to form an FMM, in particular, a stripe-type mask. For example, the patterning slit sheet 130 may be formed by etching. For example, a total number of patterning slits 131 may be more than a total number of deposition source nozzles 121.

In one embodiment, the deposition source 110 and the deposition source nozzle unit 120 combined thereto may be spaced apart from the patterning slit sheet 130 by a certain distance (e.g., a gap).

As described above, deposition is performed while the organic layer deposition assembly 100-1 is moved relative to the substrate 2. In order for the organic layer deposition assembly 100-1 to be moved relative to the substrate 2, the patterning slit sheet 130 is located spaced apart from the substrate 2 by a certain distance (e.g., a gap).

In a conventional deposition method using an FMM, deposition is typically performed with the FMM in close contact with a substrate in order to prevent formation of shadows on the substrate. However, when the FMM is formed in close contact with the substrate, defects due to the contact between the substrate and the FMM may occur. In addition, because it is difficult to move the mask with respect to the substrate, the mask and the substrate have the same size. Accordingly, the mask becomes larger as the size of a display device increases. However, it is difficult to form a large mask.

To address these problems, in the organic layer deposition assembly 100-1 according to the present embodiment, the patterning slit sheet 130 is formed spaced apart by a certain distance (e.g., a gap) from the substrate 2 on which a deposition material is to be deposited.

According to the present embodiment, deposition may be performed while a mask formed smaller than a substrate is moved with respect to the substrate, and thus, it is relatively easy to manufacture the mask. In addition, defects due to contact between the substrate and the mask may be avoided.

In addition, because it is unnecessary to closely contact the substrate with the mask during a deposition process, a manufacturing speed may be improved.

In one embodiment, referring to FIG. 4, the camera 170 may align a first mark formed on the frame 135 of the patterning slit sheet 130 and a second mark (not shown) formed on the substrate 2 in real-time. The sensor 180 may be a confocal sensor. As described above, since a distance between the substrate 2 and the patterning slit sheet 130 is measurable in real time using the camera 170 and the sensor 180, the substrate 2 may be aligned with the patterning slit sheet 130 in real time, whereby position accuracy of a pattern may be significantly improved.

The organic layer deposition assemblies 100-1 of the apparatus 1 for organic material deposition according to an embodiment of the present invention may further include a specially designed shielding member 140, i.e., a tooling shutter 140' (see FIG. 9) for controlling the thickness of an organic material layer formed on the substrate 2. Detailed description thereof is given below.

In more detail, characteristics of an organic light-emitting device largely depend on the thickness of an organic material layer. Therefore, to manufacture an organic light-emitting display apparatus with excellent quality, a tooling operation for correcting thicknesses of all organic material layers before forming the organic material layers is required. Here, the tooling operation refers to an operation for depositing an organic material to a desired thickness by depositing the organic material to a substrate having no devices deposited thereon (e.g., a TFT) at a set or predetermined deposition rate, measuring the thickness of the deposited organic material by using an analyzing device for measuring thickness, such as an ellipsometer, and changing a tooling factor (T/F) of the organic material or adjusting the deposition rate based on the measured thickness. Here, the T/F refers to control parameters in a tooling operation based on a ratio between a thickness of an organic material layer actually measured by a sensor and a target thickness of the organic material layer.

However, if a tooling operation is performed on an organic material layer to be formed on a substrate using the method in the related art, it is necessary to perform a tooling operation for each organic material layer to be formed, each deposition source, or each assembly. In other words, it is necessary to perform a tooling operation for each of the organic materials on a one-by-one basis, and thus a significant period of time is taken therefor. For example, in the case of the apparatus for organic layer deposition shown in FIG. 1, in total, there are eleven organic layer deposition assemblies that are arranged and each of the organic layer deposition assemblies includes three deposition sources. It is necessary to perform 33 tooling operations in total on all of the deposition sources. Furthermore, since it is necessary to form organic material layers on glass substrates and analyze the same, it is necessary to invest in materials for deposition and analyzing devices for the tooling operation. Therefore, the method of performing tooling operations in the related art deteriorates production efficiency and raises material costs and investment costs.

To resolve these problems, the apparatus for organic layer deposition further includes the tooling shutter 140' to control thicknesses of organic material layers formed on the substrate 2, wherein a plurality of organic material layers are formed on a single substrate and a tooling operation is performed on a plurality of deposition sources at once.

Figure 8:
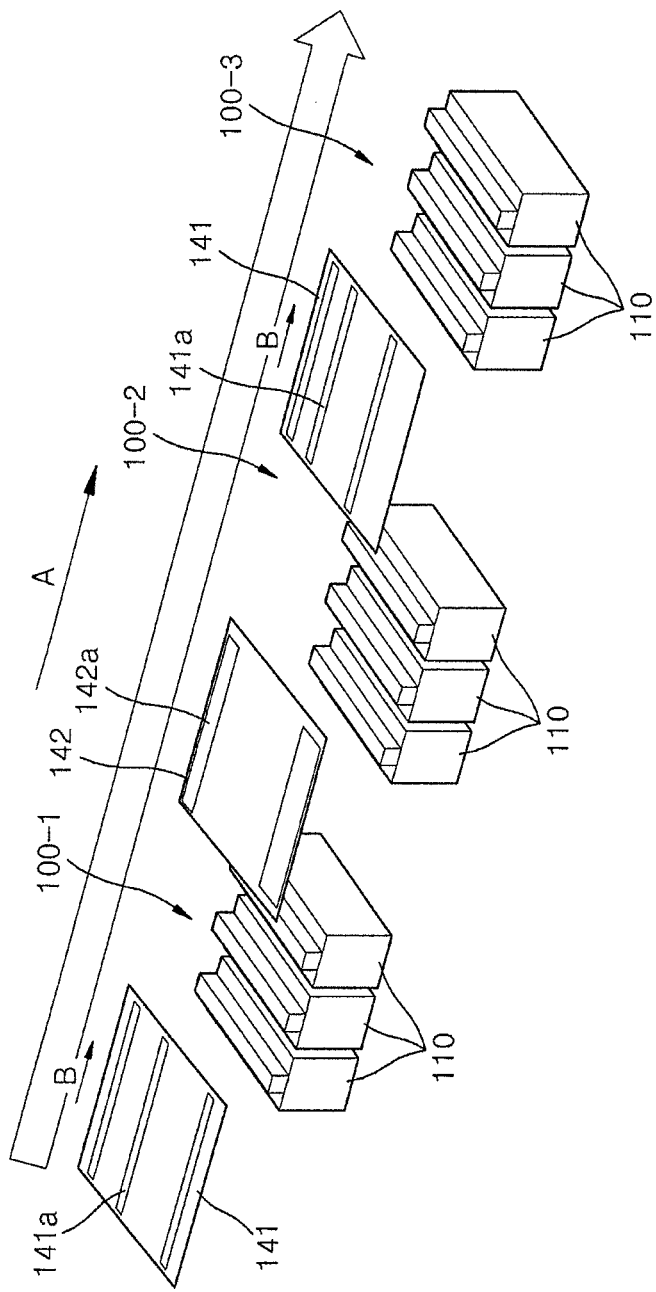
FIG. 8 is a schematic perspective view of a tooling shutter while the deposition unit of FIG. 3 is depositing an organic material layer according to an embodiment of the present invention.
Figure 9:
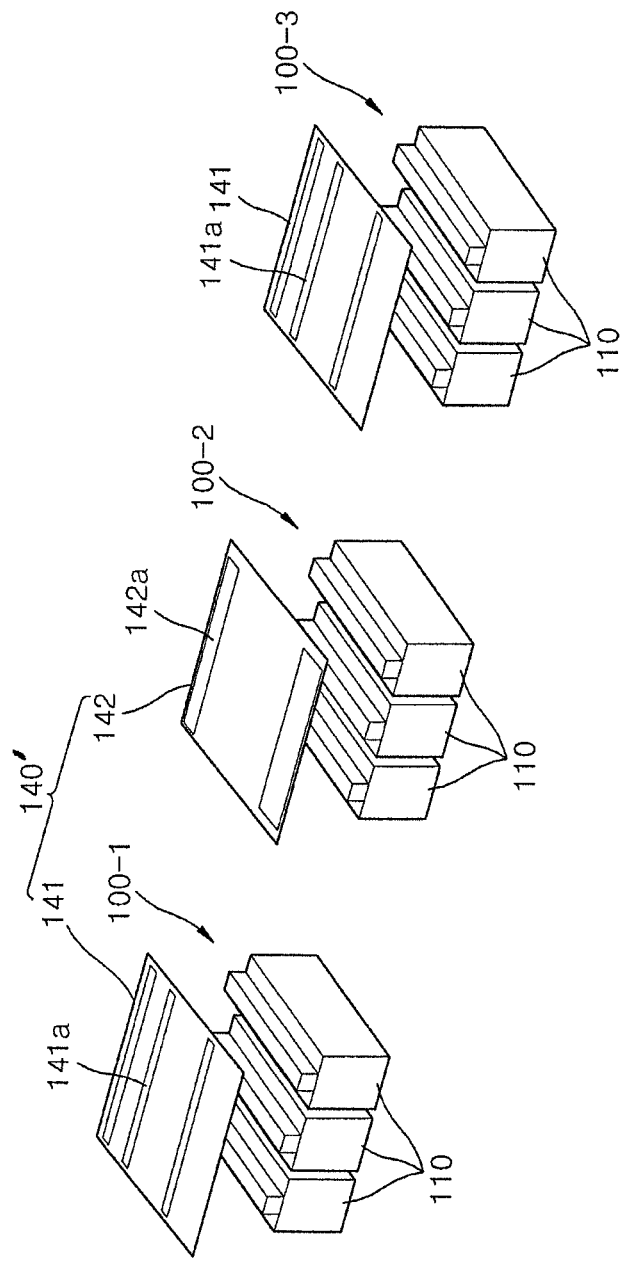
FIG. 9 is a schematic perspective view of a tooling shutter while the deposition unit of FIG. 3 in a tooling operation according to an embodiment of the present invention.

FIG. 8 is a schematic perspective view of the tooling shutter 140' while the deposition unit 100 of FIG. 3 is depositing an organic material layer, and FIG. 9 is a schematic perspective view showing the tooling shutter 140' while the deposition unit 100 is in a tooling operation.

FIGS. 8 and 9 show three organic layer deposition assemblies, assuming that the first organic layer deposition assembly 100-1 and the third organic layer deposition assembly 100-3 are organic layer deposition assemblies for depositing a common layer and the second organic layer deposition assembly 100-2 is an organic layer deposition assembly for depositing a pattern layer.

In this case, the first organic layer deposition assembly 100-1 and the third organic layer deposition assembly 100-3 for depositing a common layer respectively include first tooling shutters 141. A plurality of tooling slits 141a may be formed in the first tooling shutter 141 to have a long shape extending in a direction in which a substrate moves. An average of thicknesses of a plurality of organic material layers formed on a substrate is obtained by using the plurality of tooling slits 141a, and a tooling operation for correcting thicknesses of the organic material layers is performed based on the average.

The first tooling shutters 141 are formed to be able to move in organic layer deposition assemblies, and the first tooling shutters 141 may be arranged in front of the deposition sources 110 only when a tooling operation is performed. In other words, during deposition of an organic material layer, as shown in FIG. 8, as the first tooling shutters 141 are a set or predetermined distance apart from the deposition sources 110 in a direction, a path in which the deposition material 115 moves is formed, and thus the deposition material 115 emitted by the deposition source 110 is deposited on the substrate 2. During a tooling operation, as shown in FIG. 9, the first tooling shutters 141 are arranged in front of the deposition sources 110, and thus organic materials evaporated at the deposition sources 110 pass through the first tooling shutters 141 and form a set or predetermined pattern layer on the substrate 2.

Here, the tooling slits 141a of the first tooling shutter 141 arranged in each of the organic layer deposition assemblies may be formed to be somewhat offset to one another. In other words, the tooling slits 141a of the first organic layer deposition assembly 100-1 may not be arranged on the same lines as the tooling slits 141a of the third organic layer deposition assembly 100-3, and thus an organic material evaporated at the first organic layer deposition assembly 100-1 and an organic material evaporated at the third organic layer deposition assembly 100-3 may be deposited at different regions on a substrate.

The second organic layer deposition assembly 100-2 for deposition of a pattern layer includes a second tooling shutter 142. Tooling slits 142a for measuring thicknesses of organic material layers may be arranged at two opposite ends of the second tooling shutter 142 to have a long shape extending in a direction in which a substrate moves.

As described above, an average of thicknesses of a plurality of pattern layers formed on a substrate is obtained by using the tooling slits 142a formed at two opposite ends of the second tooling shutter 142, and a tooling operation for correcting thicknesses of the organic material layers is performed based on the average.

The second tooling shutter 142 is formed to be able to move in the organic layer deposition assembly and the second tooling shutter 142 may be arranged in front of the deposition source 110 only when a tooling operation is performed. In other words, during deposition of an organic material layer, as shown in FIG. 8, as the second tooling shutter 142 is a set or predetermined distance apart from the deposition source 110 in a direction, a path in which the deposition material 115 moves is formed, and thus the deposition material 115 emitted by the deposition source 110 is deposited on the substrate 2. During a tooling operation, as shown in FIG. 9, the second tooling shutter 142 is arranged in front of the deposition source 110, and thus organic materials evaporated at the deposition source 110 pass through the second tooling shutter 142 and form a set or predetermined pattern layer on the substrate 2.

Here, the width of the tooling slit 142*a* of the second tooling shutter 142 may be greater than the width of the patterning slit 131 of the patterning slit sheet 130. Although the width of the patterning slit 131 of the patterning slit sheet 130 is about several hundred μm and is similar to the thickness of a pattern layer, the minimum measurable thickness of a pattern layer is about 2 mm, and thus it is necessary to form the tooling slit 142*a* of the second tooling shutter 142 for a tooling operation to have a width greater than that of the patterning slit 131 of the patterning slit sheet 130.

As described above, by forming a plurality of linear pattern layers on a single substrate, a plurality of organic material layers are formed on the single substrate and a tooling operation may be performed with respect to a plurality of deposition sources at the same time.

Hereinafter, a method by which the apparatus for organic layer deposition corrects thickness will be described in more detail.

Figure 10:
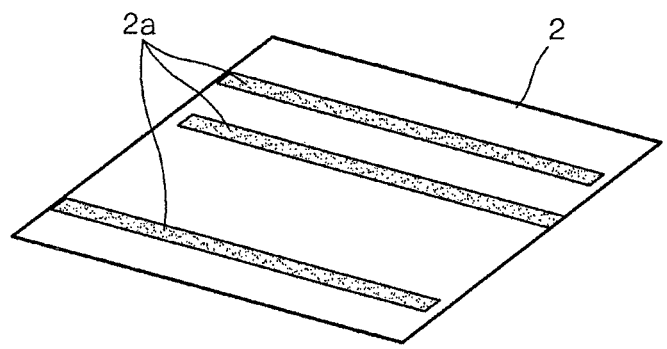
FIG. 10 is a schematic view showing that, during the tooling operation of FIG. 9, an organic material layer is formed as a substrate passes through a first organic layer deposition assembly according to an embodiment of the present invention.
Figure 11:
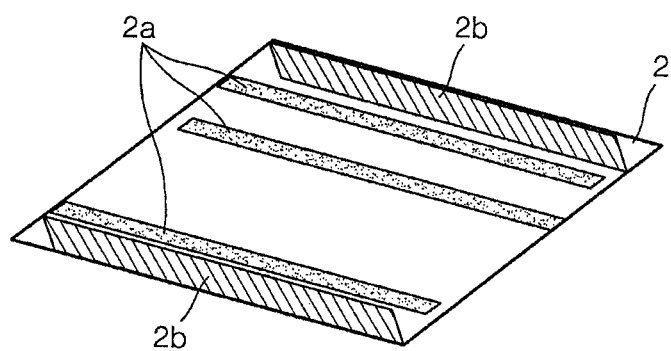
FIG. 11 is a schematic view showing that, during the tooling operation of FIG. 9, an organic material layer is formed as a substrate passes through a second organic layer deposition assembly according to an embodiment of the present invention.
Figure 12:
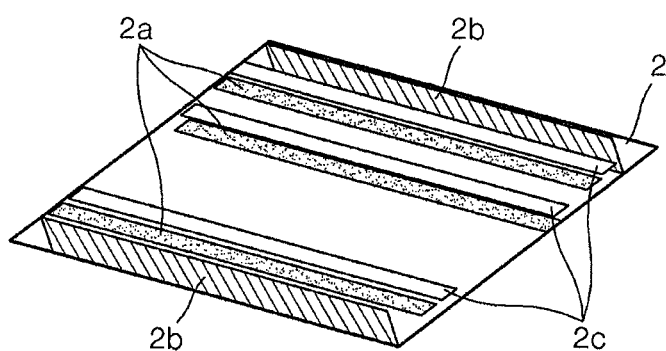
FIG. 12 is a schematic view showing that, during the tooling operation of FIG. 9, an organic material layer is formed as a substrate passes through a third organic layer deposition assembly according to an embodiment of the present invention.

FIG. 10 is a schematic view showing that, during the tooling operation of FIG. 9, an organic material layer is formed as a substrate passes through the first organic layer deposition assembly 100-1. FIG. 11 is a schematic view showing that, during the tooling operation of FIG. 9, an organic material layer is formed as the substrate passes through the second organic layer deposition assembly 100-2. FIG. 12 is a schematic view showing that, during the tooling operation of FIG. 9, an organic material layer is formed as the substrate passes through the third organic layer deposition assembly 100-3.

A comparable method of correcting thickness will be described below. First, organic material films are formed by depositing organic materials for film formation on respective deposition glass substrates by using an arbitrary T/F and an arbitrary deposition rate. Next, thicknesses of the organic material films are measured by using an analyzing device for measuring thickness, such as an ellipsometer. Target thicknesses are fulfilled by adjusting the T/F based on the measured thicknesses. Next, to determine whether the corrected T/F is accurate, it is necessary to perform tooling operations on the respective organic materials again, and, even after the formation of the organic material films, it is necessary to perform tooling operations once more in every 100 to 120 depositions.

However, by using the method of correcting thicknesses according to an embodiment of the present invention, films are formed by using a single substrate in a single pass instead of forming films with respect to each of the deposition sources. In other words, when the tooling shutters 140' are arranged as shown in FIG. 9 and the substrate 2 moves in the direction of arrow A in a tooling operation, deposition materials accommodated in the first organic layer deposition assembly 100-1 are patterned onto the substrate 2 as the substrate 2 passes through the first organic layer deposition assembly 100-1, and thus a first tooling pattern layer 2*a* is formed on the substrate 2, as shown in FIG. 10. Here, the first tooling pattern layer 2*a* is patterned by the tooling shutter 140' of the first organic layer deposition assembly 100-1.

Here, the substrate 2 continues to move and, when the substrate 2 passes through the second organic layer deposition assembly 100-2, deposition materials accommodated in the second organic layer deposition assembly 100-2 are patterned onto the substrate 2, and thus a second tooling pattern layer 2*b* is formed on the substrate 2, as shown in FIG. 11. The second tooling pattern layer 2*b* is patterned by patterning slits 131*b* of the patterning slit sheet 130 of the second organic layer deposition assembly 100-2.

Here, the substrate 2 continues to move and, when the substrate 2 passes through the third organic layer deposition assembly 100-3, deposition materials accommodated in the third organic layer deposition assembly 100-3 are patterned onto the substrate 2, and thus a third tooling pattern layer 2*c* is formed on the substrate 2, as shown in FIG. 12. The third tooling pattern layer 2*c* is patterned by the tooling shutters 140' of the third organic layer deposition assembly 100-3.

As described above, according to an embodiment of the present invention, a tooling operation is performed by using a single substrate in a single pass without forming films on different substrates according to respective deposition sources, and a period of time may be reduced as compared to a case in which thicknesses of films are measured at each of the substrates, and thus productivity may be improved. Furthermore, a unit price of a product may be reduced due to a reduction of investment based on a reduction of substrate costs and the reduced number of analyzing devices. Therefore, mass production may be significantly improved.

Figure 13:
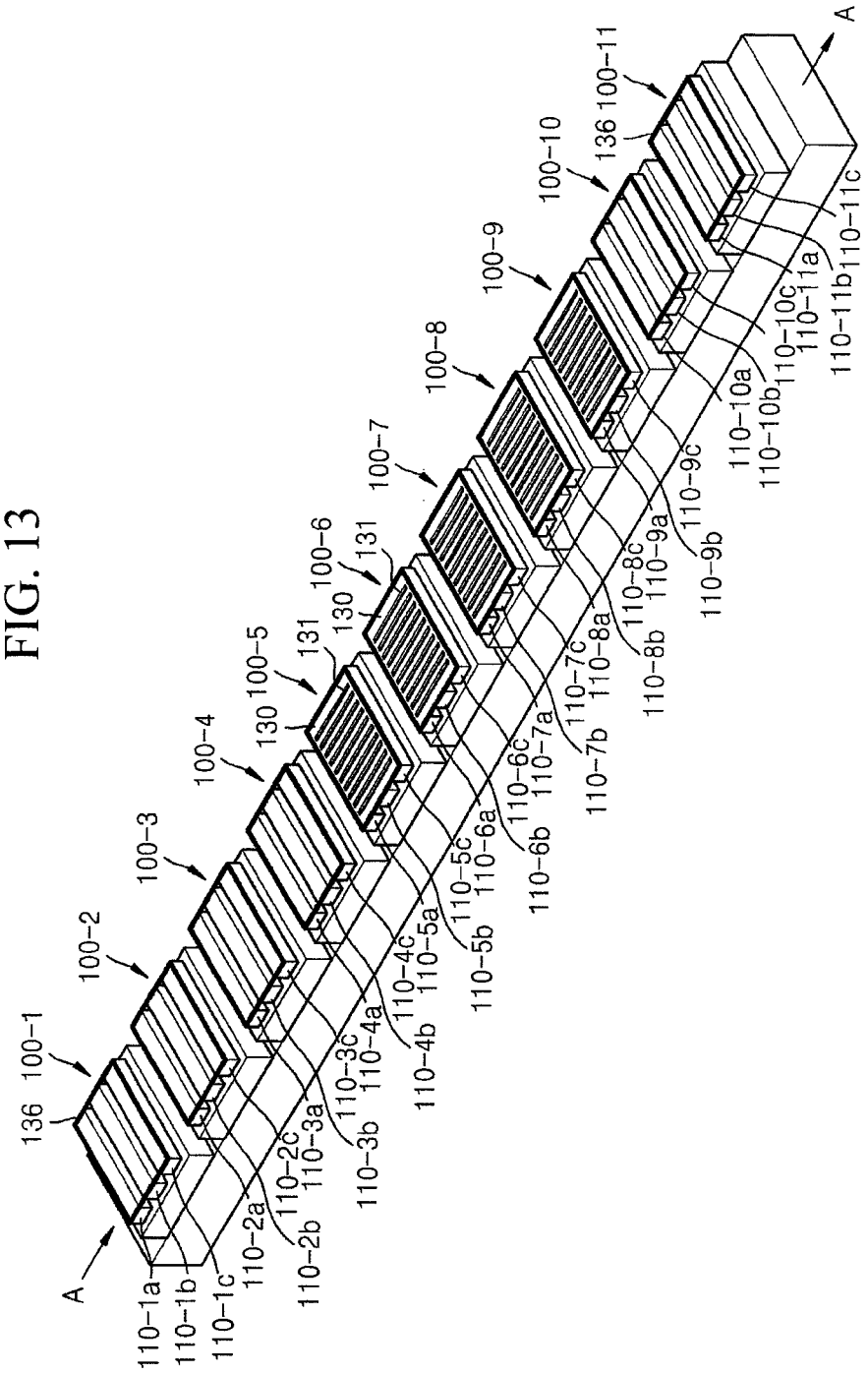
FIG. 13 is a schematic perspective view of deposition assemblies including deposition sources, according to an embodiment of the present invention.

FIG. 13 is a schematic perspective view of deposition assemblies including deposition sources, according to an embodiment of the present invention. Referring to FIG. 13, an organic layer deposition apparatus according to an embodiment of the present invention includes eleven organic layer deposition assemblies 100-1, 100-2 through 100-11. In addition, each of the deposition assemblies 100-1, 100-2 through 100-11 includes three deposition sources. For example, the deposition assembly 100-1 may include three deposition sources 110-1*a*, 110-1*b*, and 110-1*c*, and the deposition assembly 100-2 may include three deposition source 110-2*a*, 110-2*b*, and 110-2*c*.

The organic layer deposition assemblies 100-1, 100-2 through 100-11 include, as described above, the common layer deposition assemblies 100-1, 100-2, 100-3, 100-4, 100-10, and 100-11 and the pattern layer deposition assemblies 100-5 through 100-9.

Figure 26:
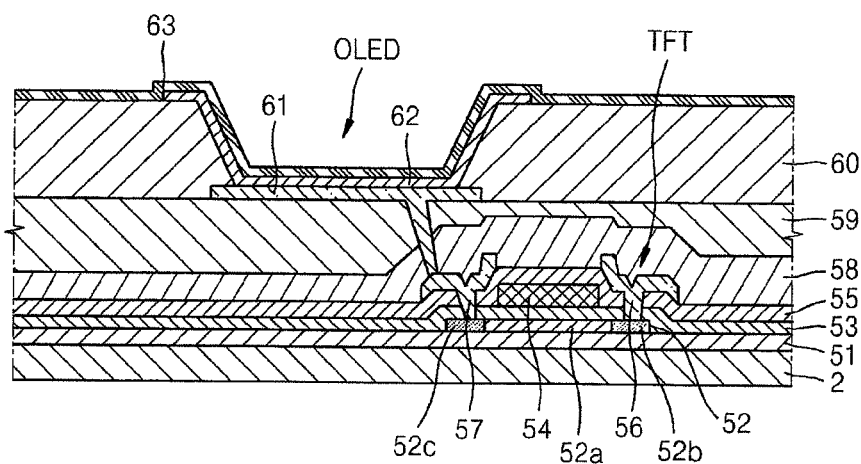
FIG. 26 is a cross-sectional view of an active matrix-type organic light-emitting display apparatus that is manufactured using an organic layer deposition apparatus according to an embodiment of the present invention.

The common layer deposition assemblies 100-1, 100-2, 100-3, 100-4, 100-10, and 100-11 may form common layers of an organic layer (for example, see OLED of FIG. 26. That is, the deposition sources 110-1*a*, 110-1*b*, and 110-1*c* of the common layer deposition assembly 100-1 may include a deposition material for forming a hole injection layer, and deposition sources 110-2*a*, 110-2*b*, and 110-2*c* of the common layer deposition assembly 100-2 may include a deposition material for forming an intermediate layer, deposition sources 110-3*a*, 110-3*b*, and 110-3*c* of the common layer deposition assembly 100-3 may include a deposition material for forming a hole transport layer, and deposition sources 110-4*a*, 110-4*b*, and 110-4*c* of the common layer deposition assembly 100-4 may include a deposition material for forming a hole injection layer. In addition, deposition sources 110-10*a*, 110-10*b*, and 110-10*c* of the common layer deposition assembly 100-10 may include a deposition material for forming an electron transport layer, and deposition sources 110-11*a*, 110-11*b*, and 110-11*c* of the common layer deposition assembly 100-11 may include a deposition material for forming an electron injection layer. The deposited layers formed by the common layer deposition assemblies 100-1, 100-2, 100-3, 100-4, 100-10, and 100-11 may be commonly formed regardless of sub-pixels. Accordingly, a patterning slit sheet, that is, an open mask 136 that has one patterning slit, may be formed on (e.g., located on or above) deposition sources of the common layer deposition assemblies 100-1, 100-2, 100-3, 100-4, 100-10, and 100-11.

Each of the pattern layer deposition assemblies 100-5, 100-6, 100-7, 100-8, and 100-9 may form a patterned layer of the organic layer 62 for a corresponding sub-pixel. That is, deposition sources 110-5a, 110-5b, and 110-5c of the pattern layer deposition assembly 100-5 may include a deposition material for forming an auxiliary layer of red and green sub-pixels, deposition sources 110-6a, 110-6b, and 110-6c of the pattern layer deposition assembly 100-6 may include a deposition material forming an auxiliary layer for a red sub-pixel, deposition sources 110-7a, 110-7b, and 110-7c of the pattern layer deposition assembly 100-7 may include a deposition material for forming a red emission layer, deposition sources 110-8a, 110-8b, and 110-8c of the pattern layer deposition assembly 100-8 may include a deposition material for forming a green emission layer, and deposition sources 110-9a, 110-9b, and 110-9c of the pattern layer deposition assembly 100-9 may include a deposition material for forming a blue emission layer.

The patterning slit sheet 130 having the patterning slits 131 may be located over deposition sources of the pattern layer deposition assemblies 100-5, 100-6, 100-7, 100-8, and 100-9.

The present invention is not limited thereto, and an organic layer deposition apparatus according to other embodiments of the present invention may include two or more deposition assemblies, and each of the deposition assemblies may include one or more deposition sources. In addition, a deposition material included in a deposition source may vary according to the structure of a device.

Figure 14:
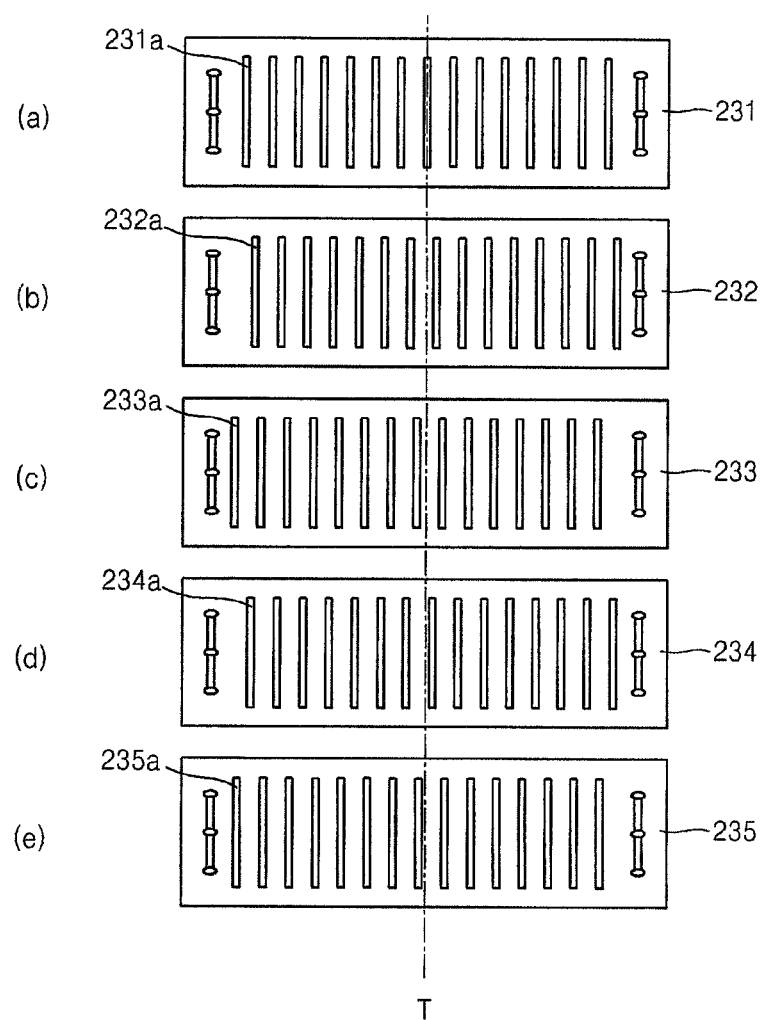
FIG. 14 is a schematic plan view of examples of correction slit sheets.

FIG. 14 is a schematic plan view of examples of correction slit sheets. When thicknesses of patterning layers are measured, correction slit sheets 231, 232, 233, 234, and 235 replace a patterning slit sheet (for example, see 130 of FIG. 4) of each pattern layer deposition assembly (for example, see 100-5, 100-6, 100-7, 100-8, and 100-9 of FIG. 137) to be located on a second stage (for example, see 160 of FIG. 4). That is, the correction slit sheets 231, 232, 233, 234, and 235 may be located on the respective second stages 160 of pattern layer deposition assemblies (see 100-5, 100-6, 100-7, 100-8, and 100-9 of FIG. 13).

Each of the correction slit sheets 231, 232, 233, 234, and 235 may respectively include (or have) a plurality of correction slits 231a, 232a, 233a, 234a, and 235a. A lengthwise direction of each of the correction slits 231a, 232a, 233a, 234a, and 235a may be parallel to the conveying (or transporting) direction of the substrate 2, that is, a first direction A, and locations of the correction slits 231a, 232a, 233a, 234a, and 235a along a second direction perpendicular to the first direction A are different from each other. That is, the correction slits 231a, 232a, 233a, 234a, and 235a may be formed such that they are offset in the second direction perpendicular to the first direction A. That is, locations of the correction slits 231a, 232a, 233a, 234a, and 235a of the correction slit sheets 231, 232, 233, 234, and 235 located on the pattern layer deposition assemblies 100-5, 100-6, 100-7, 100-8, and 100-9 may be different from each other with respect to the first direction A. Accordingly, when deposition materials that have passed through the correction slits 231a, 232a, 233a, 234a, and 235a are deposited on the substrate 2 to form pattern layers, the formed pattern layers do not overlap.

When thicknesses of pattern layers are measured, among deposition sources of the pattern layer deposition assemblies 100-5, 100-6, 100-7, 100-8, and 100-9, deposition sources 110-5a, 110-6a, 110-7a, 110-8a, and 110-9a are operated, and operations of the other deposition sources 110-5b, 110-5c, 110-6b, 110-7b, 110-7c, 110-8b, 110-8c, 110-9b, and 110-9c are stopped, or shutters (not shown in FIG. 14) are used to prevent their deposition materials from reaching correction substrates, and in this state, a first correction substrate is conveyed (e.g., transported) in the first direction A and deposition materials of the operated deposition sources 110-5a, 110-6a, 110-7a, 110-8a, and 110-9a are allowed to be deposited on the first correction substrate. When the first correction substrate has completely passed through the deposition units, deposition sources 110-5b, 110-6b, 110-7b, 110-8b, and 110-9b are operated, and while deposition materials of deposition sources other than the deposition sources 110-5b, 110-6b, 110-7b, 110-8b, 110-9b are prevented from reaching the second correction substrate, the second correction substrate is conveyed (or transported) in the first direction A to allow deposition materials ejected from deposition sources to be deposited on the second correction substrate. When the second correction substrate has completely passed through the deposition units, deposition sources 110-5c, 110-6c, 110-7c, 110-8c, and 110-9c are operated, and while deposition materials of deposition sources other than the deposition sources 110-5c, 110-6c, 110-7c, 110-8c, and 110-9c are prevented from reaching the second correction substrate, the third correction substrate is conveyed (or transported) in the first direction A to allow deposition materials ejected from deposition sources to be deposited on the third correction substrate.

As described above, when a deposition process is performed to measure thicknesses of pattern layers by using the correction slit sheets 231, 232, 233, 234, and 235, the number of correction substrates used to measure a thickness of a pattern layer may be the same as the number of deposition sources included in a pattern layer deposition assembly. For example, because each of the pattern layer deposition assemblies 100-5, 100-6, 100-7, 100-8, and 100-9 includes, as illustrated in FIG. 7, three deposition sources, three correction substrates are used to measure thicknesses of pattern layers of the deposition sources 110-5a, 110-5b, 110-5c, . . . , 110-9a, 110-9b, and 110-9c.

For example, the use of the correction slit sheets 231, 232, 233, 234, and 235 enable thicknesses of pattern layers formed by using deposition sources to be measured with three correction substrates. That is, when the correction slit sheets 231, 232, 233, 234, and 235 having the correction slits 231a, 232a, 233a, 234a, and 235a that are offset from each other are not used, a total of 15 correction substrates, which is the same number as the number of deposition sources 110-5a, 110-5b, 110-5c, . . . , 110-9a, 110-9b, 110-9c, may be required to measure thicknesses of pattern layers formed by using deposition sources. However, because the correction slit sheets 231, 232, 233, 234, and 235 according to an embodiment of the present invention include the correction slits 231a, 232a, 233a, 234a, and 235a that are offset from each other, pattern layers formed by deposition sources of the pattern layer deposition assemblies 100-5, 100-6, 100-7, 100-8, and 100-9 do not overlap. Accordingly, when the number of correction substrates is the same as the number (three in the embodiment illustrated in FIG. 13) of deposition sources of the pattern layer deposition assemblies 100-5, 100-6, 100-7, 100-8, and 100-9, thicknesses of pattern layers formed by deposition sources of the pattern layer deposition assemblies 100-5, 100-6, 100-7, 100-8, and 100-9 may be measured. By doing so, time and costs for the measurement and correction of thicknesses of pattern layers may be reduced.

Lengths of the correction slits 231a, 232a, 233a, 234a, and 235a may all be the same in the embodiment illustrated in FIG. 14.

Figure 15:
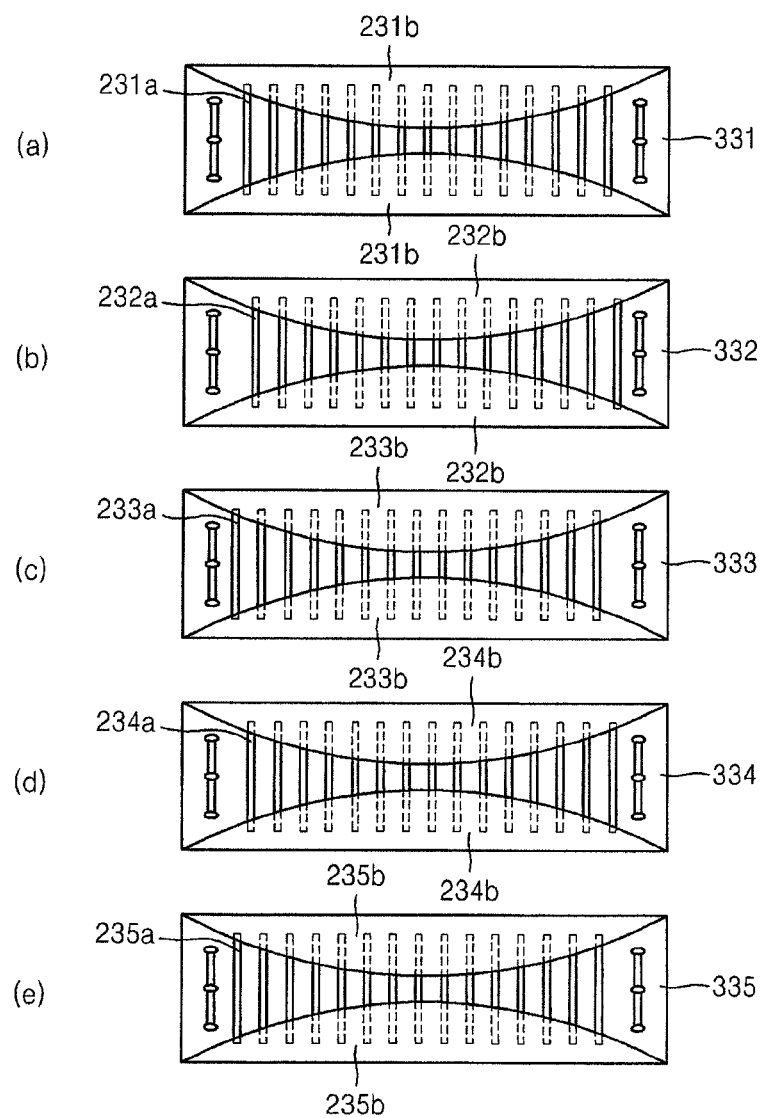
FIG. 15 is a schematic plan view of other examples of correction slit sheets.

FIG. 15 is a schematic plan view of other examples of correction slit sheets.

Correction plates 231b, 232b, 233b, 234b, and 235b are respectively located or positioned on surfaces of the correction slit sheets 331, 332, 333, 334, and 335 to block at least a portion of a deposition material ejected from each deposition source.

The correction plates 231b, 232b, 233b, 234b, and 235b are shaped such that the height (or width) of the correction plates is maximum at a location near the respective centers of the correction slit sheets 331, 332, 333, 334, and 335, and the height (or width) decreases as respective portions of the correction plates approach edges of the respective correction slit sheets. In other words, a gap between each pair of the correction plates 231b, 232b, 233b, 234b, and 235b is at a minimum at a location near central portions of the respective correction slit sheets 331, 332, 333, 334, and 335, and the gap between the pair of the correction plates becomes wider as portions of the correction plates 231b, 232b, 233b, 234b, and 235b approach respective end portions of the correction slit sheets 331, 332, 333, 334, and 335. As illustrated in FIG. 15, the correction plates 231b, 232b, 233b, 234b, and 235b may have a shape of a circular arc or cosine.

The correction plates 231b, 232b, 233b, 234b, and 235b having such a shape may result in a greater amount of shield deposition material at the center of a correction slit sheet than at an end of the correction slit sheet.

According to another embodiment of the present invention, instead of blocking a deposition material by using the correction plates 231b, 232b, 233b, 234b, and 235b, correction slits of a correction slit sheet may be formed to have different lengths to block a deposition material. That is, correction slits of each correction slit sheet may have greater lengths away from the center of the correction slit sheet.

Figure 16:
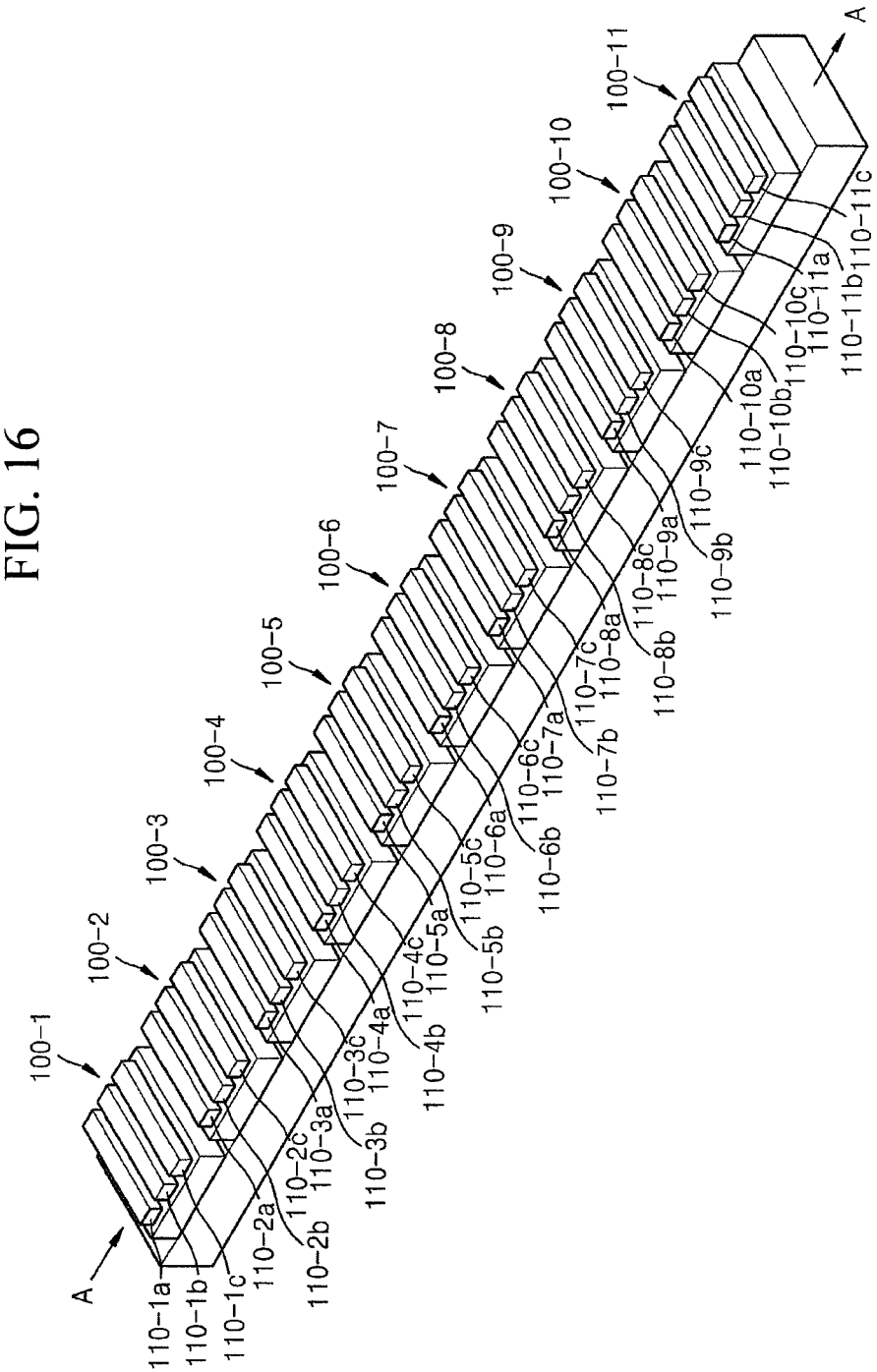
FIG. 16 is a schematic perspective view of deposition assemblies each including a deposition unit, according to an embodiment of the present invention.

FIG. 16 is a schematic perspective view of deposition assemblies each including a deposition unit, according to an embodiment of the present invention. Referring to FIG. 16, an organic layer deposition apparatus according to an embodiment of the present invention may include 11 deposition assemblies 100-1 through 100-11. Also, each of the deposition assemblies 100-1 through 100-11 may include three deposition sources. For example, the deposition assembly 100-1 includes three deposition sources 110-1a through 110-1c, and the deposition assembly 100-2 may include three deposition sources 110-2a through 110-2c.

Each of the deposition assemblies 100-1 through 100-4, 100-10 and 100-11 may form a common layer in an organic layer 62 of FIG. 26. In other words, the deposition sources 110-1a through 110-1c of the deposition assembly 100-1 may include a deposition material for forming a hole injection layer, the deposition sources 110-2a through 110-2c of the deposition assembly 100-2 may include a deposition material for forming an injection layer, deposition sources 110-3a through 110-3c of the deposition assembly 100-3 may include a deposition material for forming a hole transport layer, and deposition sources 110-4a through 110-4c of the deposition assembly 100-4 may include a deposition material for forming a hole injection layer. Also, deposition sources 110-10a through 110-10c of the deposition assembly 100-10 may include a deposition material for forming an electron transport layer, and deposition sources 110-11a through 110-11c of the deposition assembly 100-11 may include a deposition material for forming an electron injection layer. Deposition layers formed by some of the deposition assemblies 100-1, 100-2, 100-3, 100-4, 100-10, and 100-11 may be commonly formed regardless of a sub-pixel. Accordingly, a patterning slit sheet, i.e., an open mask, including one patterning slit may be may be disposed on the deposition sources of the deposition assemblies 100-1, 100-2, 100-3, 100-4, 100-10, and 100-11.

Each of other deposition assemblies 100-5, 100-6, 100-7, 100-8, and 100-9 may form a patterned layer according to sub-pixels in the organic layer 62. In other words, deposition sources 110-5a through 110-5c of the deposition assembly 100-5 may include a deposition material for forming an assistant layer of red and green sub-pixels, deposition sources 110-6a through 110-6c of the deposition assembly 100-6 may include a deposition material for forming an assistant layer of a red sub-pixel, deposition sources 110-7a through 110-7c of the deposition assembly 100-7 may include a deposition material for forming a red emission layer, deposition sources 110-8a through 110-8c of the deposition assembly 100-8 may include a deposition material for forming a green emission layer, and deposition sources 110-9a through 110-9c of the deposition assembly 100-9 may include a deposition material for forming a blue emission layer.

The patterning slit sheet 130 including the plurality of patterning slits 131 may be located at the deposition sources of the deposition assemblies 100-5, 100-6, 100-7, 100-8, and 100-9.

However, the present invention is not limited thereto and the organic layer deposition apparatus according to an embodiment of the present invention may include two or more deposition assemblies and each of the deposition assembles may include one or more deposition sources. Also, any suitable one of various types of deposition materials may be included in a deposition source according to a device structure.

Figure 17:
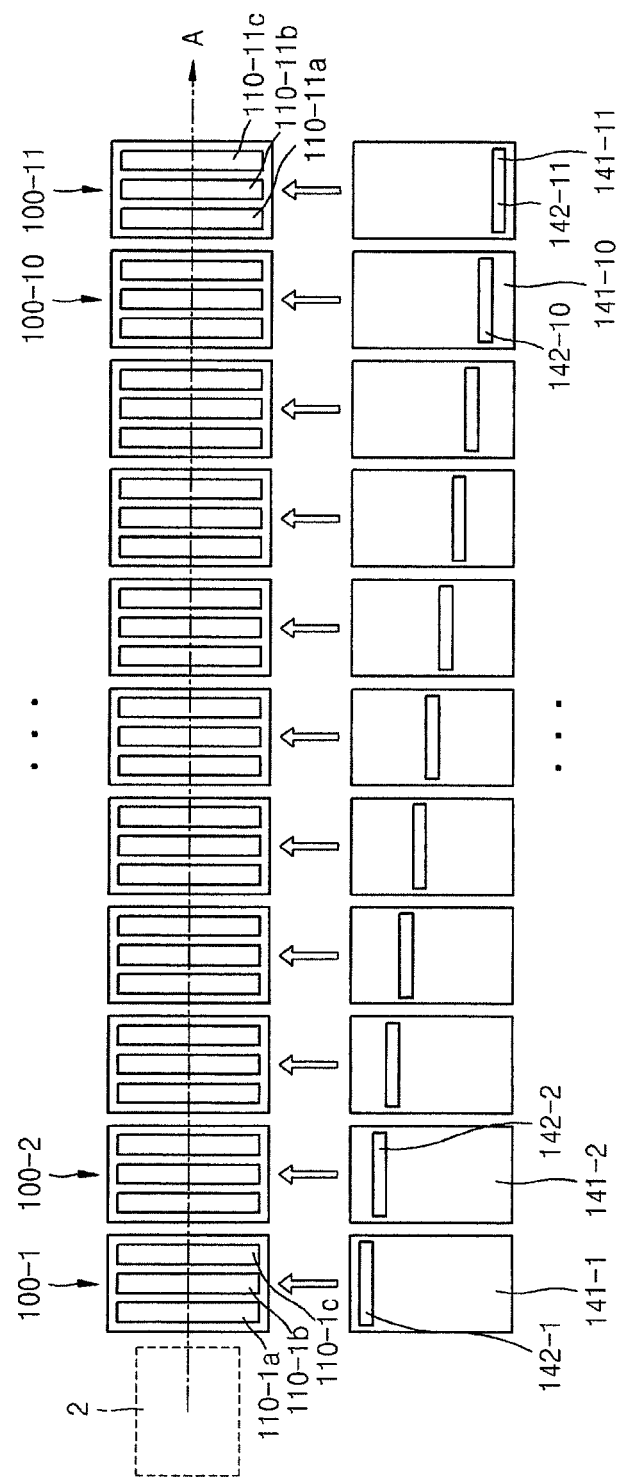
FIGS. 17 and 18 are schematic plan views illustrating operations of modification shutters, according to an embodiment of the present invention.
Figure 18:
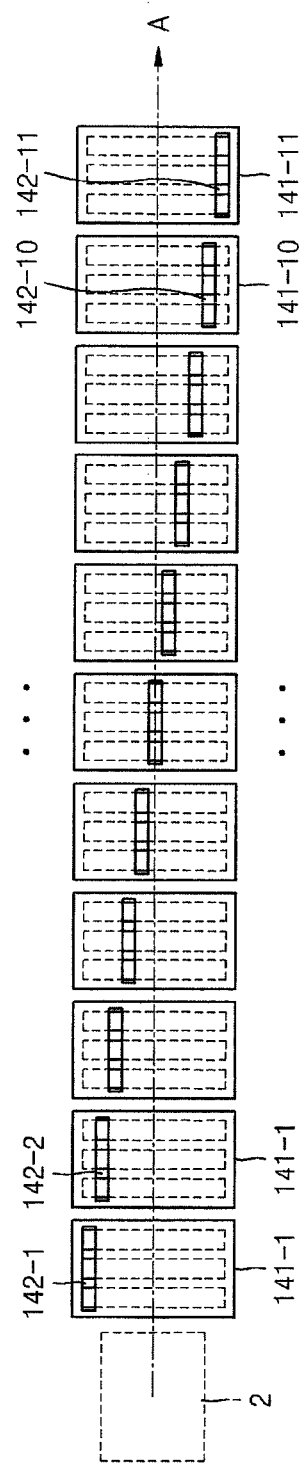

FIGS. 17 and 18 are schematic plan views that illustrate operations of modification shutters 141-1 through 141-11, according to an embodiment of the present invention. FIG. 17 is a plan view before the modification shutters 141-1 through 141-11 are respectively located on the deposition assemblies 100-1 through 100-11, and FIG. 18 is a plan view after the modification shutters 141-1 through 141-11 are respectively located on the deposition assemblies 100-1 through 100-11.

As shown in FIG. 18, the modification shutters 141-1 through 141-11 may be located between the deposition source 110 and the patterning slit sheet 130, and may respectively include openings 142-1 through 142-11 configured to allow the deposition material 115 to pass-through towards the patterning slit sheet 130. The openings 142-1 through 142-11 may be elongated in a first direction A. The openings 142-1 through 142-11 of the modification shutters 141-1 through 141-11 are parallel to the first direction A in lengths, but have different locations. In other words, the openings 142-1 through 142-11 may be configured to be offset from each other along a direction (second direction) perpendicular to the first direction A. Accordingly, when the deposition materials that passed through the openings 142-1 through 142-11 form pattern layers deposited on a modifying substrate 2, the pattern layers formed by the deposition assemblies 100-1 through 100-11 do not overlap each other. Because there are a total of 11 deposition assemblies 100-1 through 100-11 in FIGS. 17 and 18, 11 un-overlapping pattern layers may be formed through the openings 142-1 through 142-11 along the second direction.

Generally, the deposition unit 100 of FIG. 1 includes m organic layer deposition assemblies, and each of the m organic layer deposition assemblies may include n deposition sources and one modification shutter. Here, m and n may each be a natural number greater than or equal to 2.

When a thickness of an organic layer is measured, the (n−1)th deposition source may be activated, and a modifying substrate (e.g., the substrate on which organic layers are to be deposited for thickness measurement) may be transferred (or transported) in a first direction and a deposition material from the activated (n−1)th deposition source may be deposited on the modifying substrate while deposition materials from other deposition sources other than the (n−1)th deposition source are blocked from reaching the modifying substrate. When the modifying substrate is out of a deposition unit, the (n)th deposition source is activated, and the modifying substrate is transferred in the first direction and a deposition material from the activated (n)th deposition source may be deposited on the modifying substrate while deposition materials of other deposition sources other than the (n)th deposition source are blocked from reaching the modifying substrate. Referring to FIGS. 17 and 18, the modification shutters 141-1 through 141-11 may be used to measure thicknesses of organic layers formed on a substrate.

For example, the modification shutters 141-1 through 141-11 are located at one side of the deposition sources 110-1a, 110-1b, 110-1c, . . . , 110-11a, 110-11b, 110-11c as shown in FIG. 17 before measuring the thicknesses of organic layers, and when the thicknesses are to be measured, the modification shutters 141-1 through 141-11 are arranged on the deposition sources 110-1a, 110-1b, 110-1c, . . . , 110-11a, 110-11b, 110-11c as shown in FIG. 18. Then, a deposition process may be performed as the modifying substrate 2 moves along the first direction A. When the deposition process is performed on the modifying substrate 2, the deposition sources 110-1a, 110-2a, . . . , 110-11a nearest to the modifying substrate 2 before transference from among the deposition sources 110-1a, 110-1b, 110-1c, . . . , 110-11a, 110-11b, 110-11c are activated and the deposition materials of the deposition sources 110-1a, 110-2a, . . . , 110-11a are deposited on the modifying substrate 2. Here, deposition sources 110-1b, 110-1c, 110-2b, 110-2b, . . . , 110-11b, 110-11c other than the deposition sources 110-1a, 110-2a, . . . , 110-11a may be stopped from being activated or blocked by the shielding member 140 of FIG. 3 such that the deposition materials thereof do not reach the modifying substrate 2.

After the deposition processes are all performed by the deposition sources 110-1a, 110-2a, . . . , 110-11a, deposition sources 110-1b, 110-2b, 110-11b adjacent to the deposition sources 110-1a, 110-2a, . . . , 110-11a are activated, and other deposition sources 110-1a, 110-1c, 110-2a, 110-2c, . . . , 110-11a, 110-11c are stopped from being activated or blocked by the shielding member 140 such that the deposition materials thereof do not reach the modifying substrate 2.

When the deposition process for measuring the thickness of the organic layer is performed as such, the number of modifying substrates 2 equal to the number of deposition sources included in one deposition assembly is used to measure the thickness of the organic layer. For example, referring to FIGS. 17 and 18, because three deposition sources are included in each of the deposition assemblies 100-1 through 100-11, three modifying substrates 2 may be used to measure the thickness of the organic layer formed by each of the deposition sources 110-1a, 110-1b, 110-1c, . . . , 110-11a, 110-11b, 110-11c.

By using such modification shutters 141-1 through 141-11, the thicknesses of the organic layers deposited on the three modifying substrates 2 by each deposition sources may be measured. In other words, when the modification shutters 141-1 through 141-11 having the openings 142-1 through 142-11 that are offset from each other are not used, the number of modifying substrates 2 equal to the number of the deposition sources 110-1a, 110-1b, 110-1c, . . . , 110-11a, 1101-11b, 110-11c may be required to measure the thickness of the organic layer formed by each deposition source. However, because the modification shutter 141-1 through 141-11 respectively include the openings 142-1 through 142-11 that are offset from each other, the organic layers formed by the deposition sources of the deposition assemblies 100-1 through 100-11 do not overlap each other. Thus, the thicknesses of the organic layers formed by the deposition sources of the deposition assemblies 100-1 through 100-11 may be measured by using the number of modifying substrates 2 equal to the number of the deposition sources included in each of the deposition assemblies 100-1 through 100-11. Accordingly, times required to measure and compensate for the thickness of the organic layer may be reduced, and costs for measuring and compensating for the thickness of the organic layer may be reduced.

Figure 19:
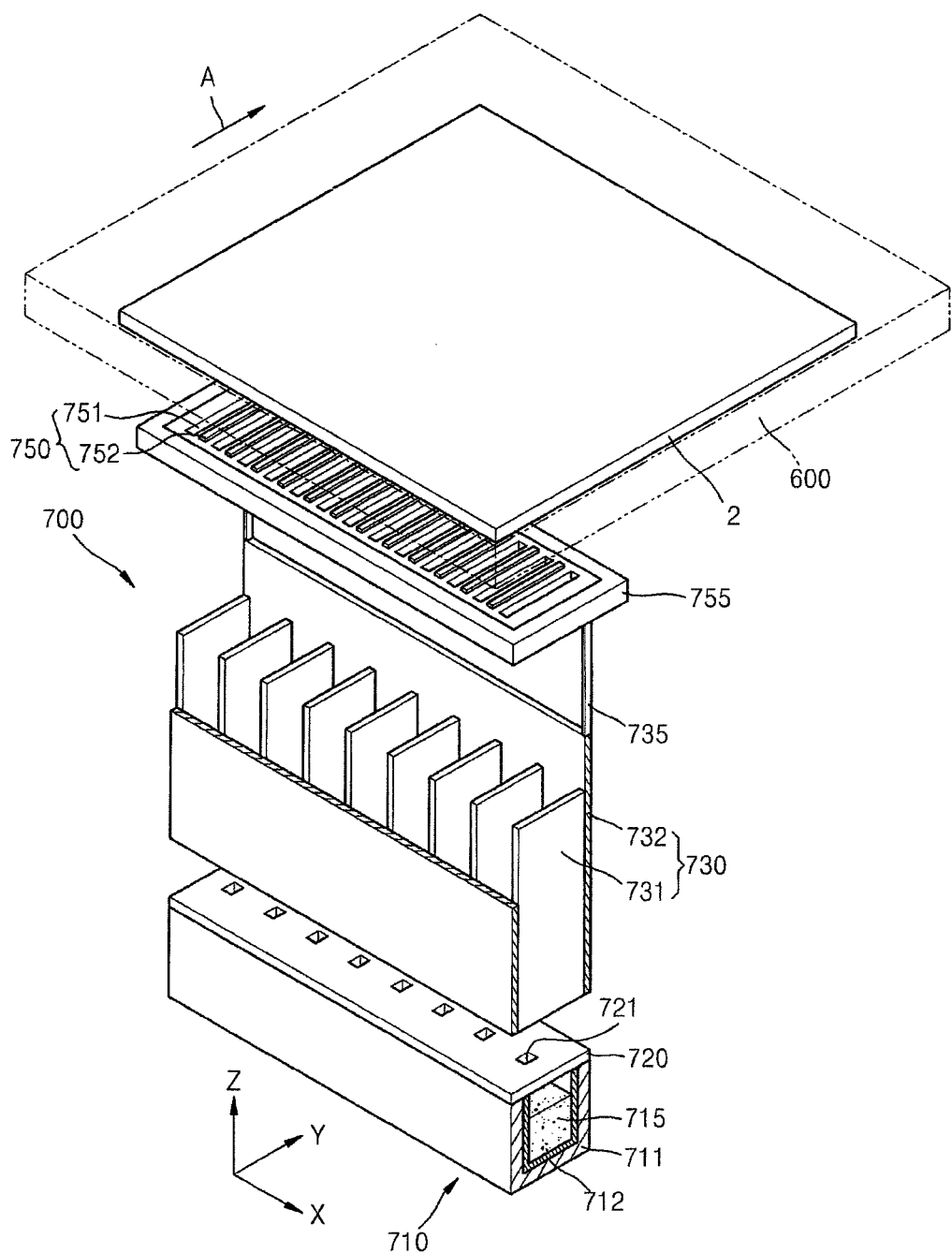
FIG. 19 is a schematic view of an organic layer deposition assembly according to another embodiment of the present invention.
Figure 20:
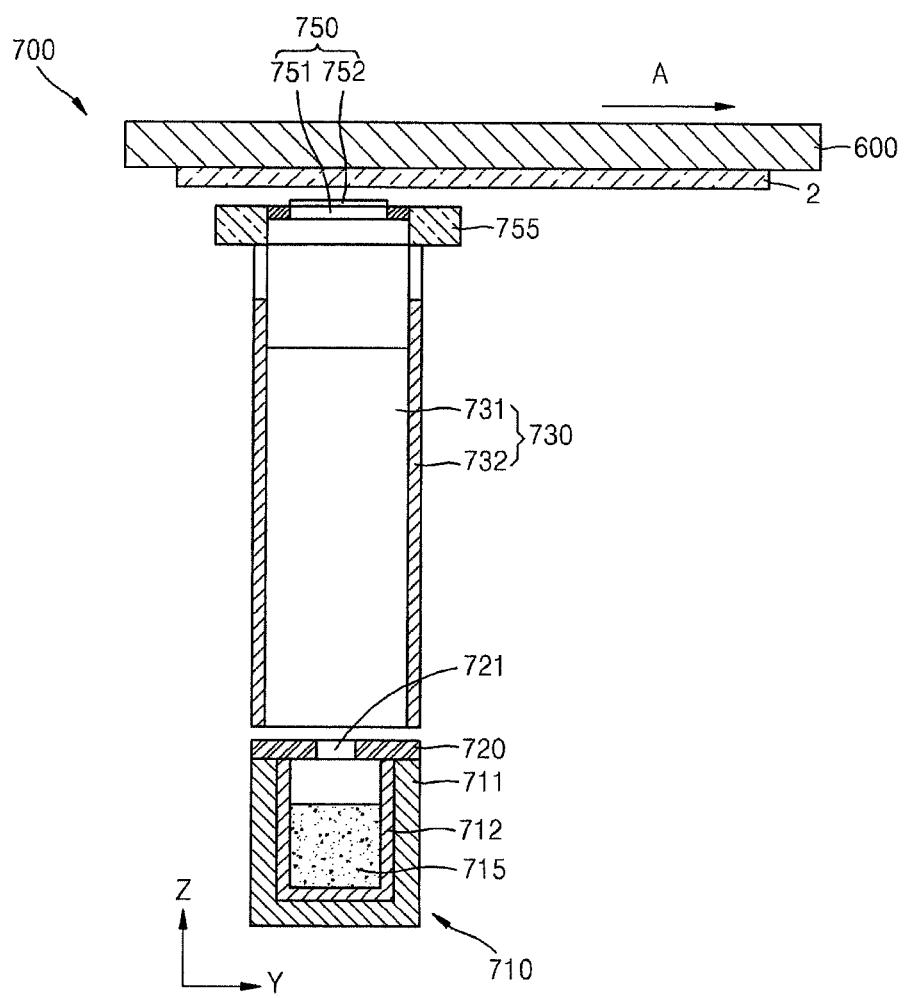
FIG. 20 is a schematic side-sectional view of the organic layer deposition assembly of FIG. 19.
Figure 21:
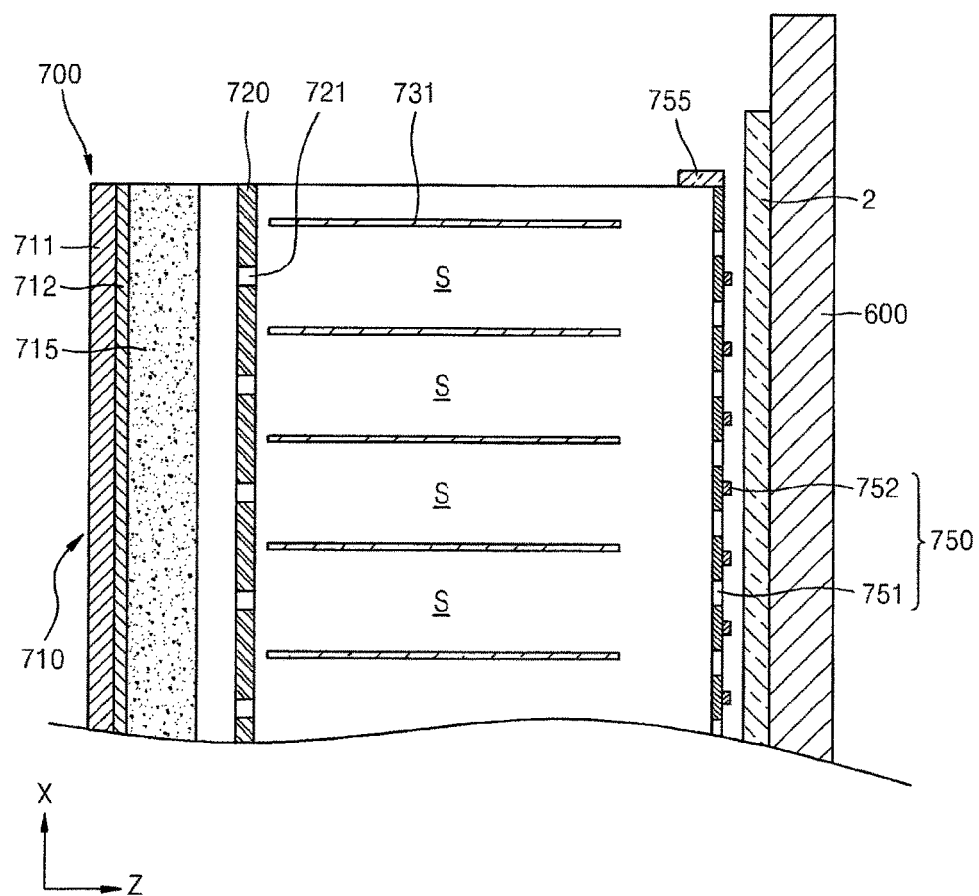
FIG. 21 is a schematic plan sectional view of the organic layer deposition assembly of FIG. 19.

FIG. 19 is a schematic perspective view of an organic layer deposition assembly 700 according to another embodiment of the present invention, FIG. 20 is a schematic side-sectional view of the organic layer deposition assembly 700 of FIG. 19, and FIG. 21 is a schematic plan sectional view of the organic layer deposition assembly 700 of FIG. 19.

Referring to FIGS. 19 to 21, the organic layer deposition assembly 700 according to the present embodiment includes a deposition source 710, a deposition source nozzle unit 720, a shielding assembly (e.g., a barrier assembly or a barrier plate assembly) 730, and a patterning slit sheet 750.

The deposition source 710 includes a crucible 711 that is filled with a deposition material 715 and a heater 712 that heats the crucible 711 so as to vaporize the deposition material 715 toward the deposition source nozzle unit 720. The deposition source nozzle unit 720 is located at a side of the deposition source 710. The deposition source nozzle unit 720 includes a plurality of deposition source nozzles 721 arranged along an X-axis direction.

In addition, the shielding plate assembly 730 is located at a side of the deposition source nozzle unit 720. The shielding plate assembly 730 includes a plurality of shielding plates (e.g., barrier plates) 731, and a shielding frame 732 located outside (e.g., around or surrounding) the shielding plates 731. The shielding plates 731 may be arranged parallel to each other along the X-axis direction. In this regard, the shielding plates 731 may be equidistant from each other. In addition, the shielding plates 731 may extend along a YZ plane, as illustrated in FIG. 19, and may be rectangular. The shielding plates 731 may divide (e.g., define) a space between the deposition source nozzle unit 720 and the patterning slit sheet 750 into a plurality of deposition spaces S. That is, in the organic layer deposition assembly 700 according to the present embodiment, due to the shielding plates 731, as illustrated in FIG. 19, each of the deposition source nozzles 721 through which deposition materials are emitted has a deposition space S. As described above, because the shielding plates 731 divide a space between the deposition source nozzle unit 720 and the patterning slit sheet 750 into a plurality of deposition spaces S, a deposition material ejected from one deposition source nozzle 721 may not be mixed with a deposition material ejected from another deposition source nozzle 721 and may pass through a patterning slit 751 of the patterning slit sheet 750 to be deposited on a substrate 2 attached to an electrostatic chuck 600. That is, the shielding plates 731 may prevent deposition materials ejected (or discharged) through the respective deposition source nozzles 721 from being dispersed and may guide their movement paths, that is, guide them to move in a Z-axis direction.

As described above, the shielding plates 731 may provide linearity of a deposition material, and thus, the size of shadows formed on the substrate 2 may be reduced (e.g., substantially reduced), and accordingly, it is possible to keep the organic layer deposition assembly 700 spaced apart from the substrate 2 by a certain distance (e.g., a gap).

In one embodiment, the patterning slit sheet 750 may be located between the deposition source 710 and the substrate 2. The patterning slit sheet 750 may further include a frame 755 having a shape similar to a window frame. The patterning slit sheet 750 includes patterning slits 751 arranged in the X-axis direction with regions or spacers 752 therebetween. The deposition material 715 that has been vaporized in the deposition source 710 passes through the deposition source nozzle unit 720 and the patterning slit sheet 750 and then moves toward the substrate 2.

Figure 22:
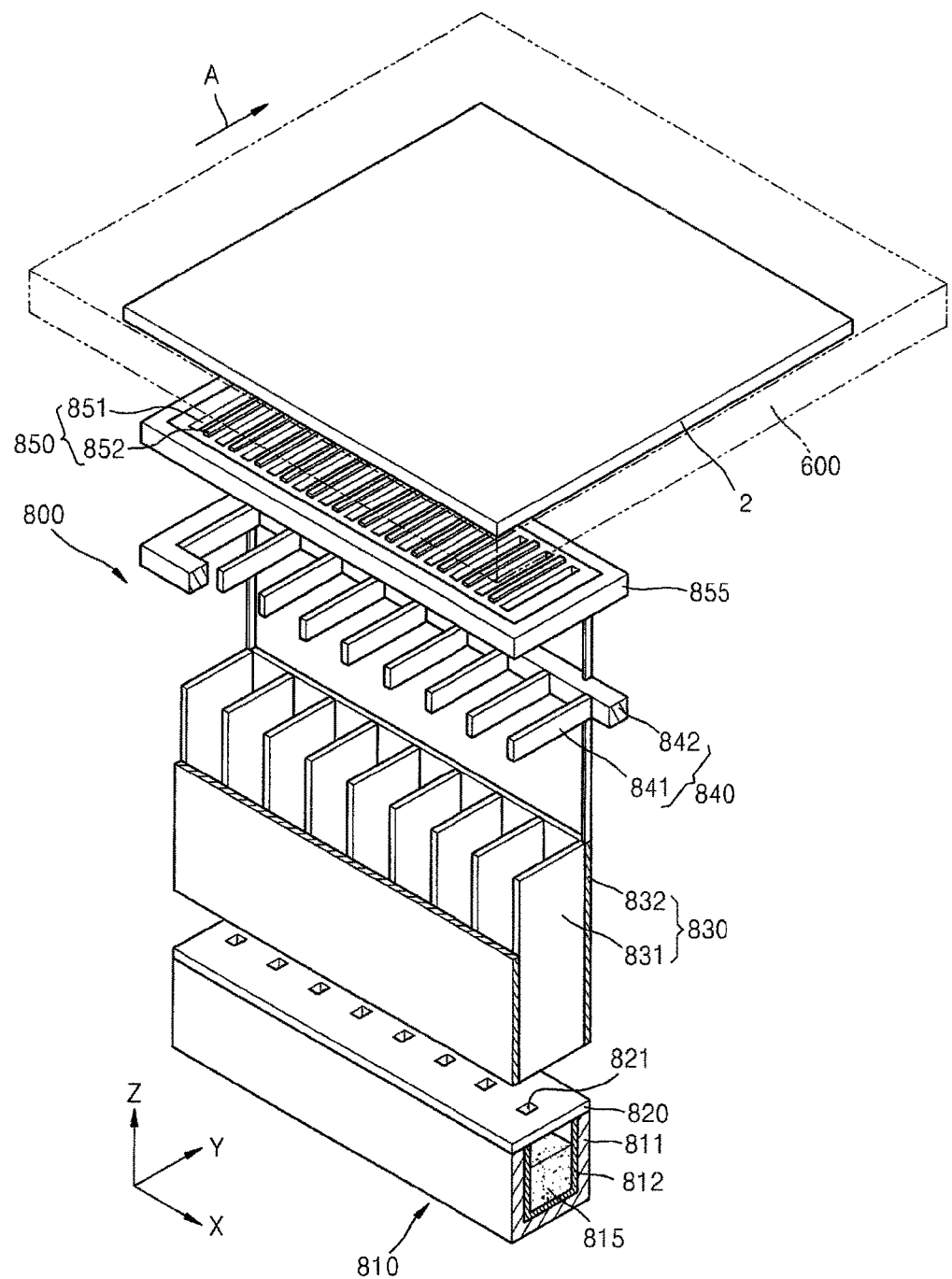
FIG. 22 is a schematic view of an organic layer deposition assembly according to another embodiment of the present invention.

FIG. 22 is a schematic perspective view of an organic layer deposition assembly 800 according to another embodiment of the present invention.

Referring to FIG. 22, an organic layer deposition assembly 800 according to the present embodiment includes a deposition source 810, a deposition source nozzle unit 820, a first shielding plate assembly (e.g., a first barrier plate assembly) 830, a second shielding plate assembly (e.g., a second barrier plate assembly) 840, and a patterning slit sheet 850. In this regard, detailed structures of the deposition source 810, the first shielding plate assembly 830, and the patterning slit sheet 850 are substantially the same as described with reference to the embodiment illustrated in FIG. 19, and thus, description thereof is not presented herein. The organic layer deposition assembly 800 according to the present embodiment is different from the organic layer deposition assembly 700 according to the previous embodiment in that the second shielding plate assembly 840 is located at one side of the first shielding plate assembly 830.

For example, the second shielding plate assembly 840 includes a plurality of second shielding plates (e.g., barrier plates) 841, and a second shielding frame 842 located outside (e.g., around or surrounding) the second shielding plates 841. The second shielding plates 841 may be arranged in parallel to each other along the X-axis direction. In this regard, the second shielding plates 841 may be equidistant from each other. In addition, the respective second shielding plates 841 may be formed to be (arranged in) parallel to a YZ plane in FIG. 22, that is, may be formed (e.g., arranged or oriented) in a direction perpendicular to the X-axis direction.

The first shielding plates 831 and the second shielding plates 841 arranged as described above may divide a space between the deposition source nozzle unit 820 and the patterning slit sheet 850. That is, due to the first shielding plates 831 and the second shielding plates 841, the deposition space is divided into a plurality of deposition spaces respectively corresponding to the deposition source nozzles 821 through which deposition materials are ejected.

In this regard, the second shielding plates 841 may be located correspondingly to the first shielding plates 831, respectively. In other words, the respective second shielding plates 841 are aligned with the respective first shielding plates 831 such that the respective second shielding plates 841 are parallel to the respective first shielding plates 831. That is, a first shielding plate and a second shielding plate corresponding thereto may be located on the same plane. Although in FIG. 22, widths (or thicknesses) of the first shielding plates 831 in the X-axis direction appear to be the same as X-axis direction widths of the second shielding plates 841, embodiments of the present invention are not limited thereto. That is, the second shielding plates 841 that require fine alignment with patterning slits 851 may be formed to be relatively thin, and the first shielding plates 831 that do not require fine alignment with the patterning slits 851 may be formed to be relatively thick, enabling ease of manufacturing thereof. Regions or spacers 852 are between the patterning slits 851.

Figure 23:
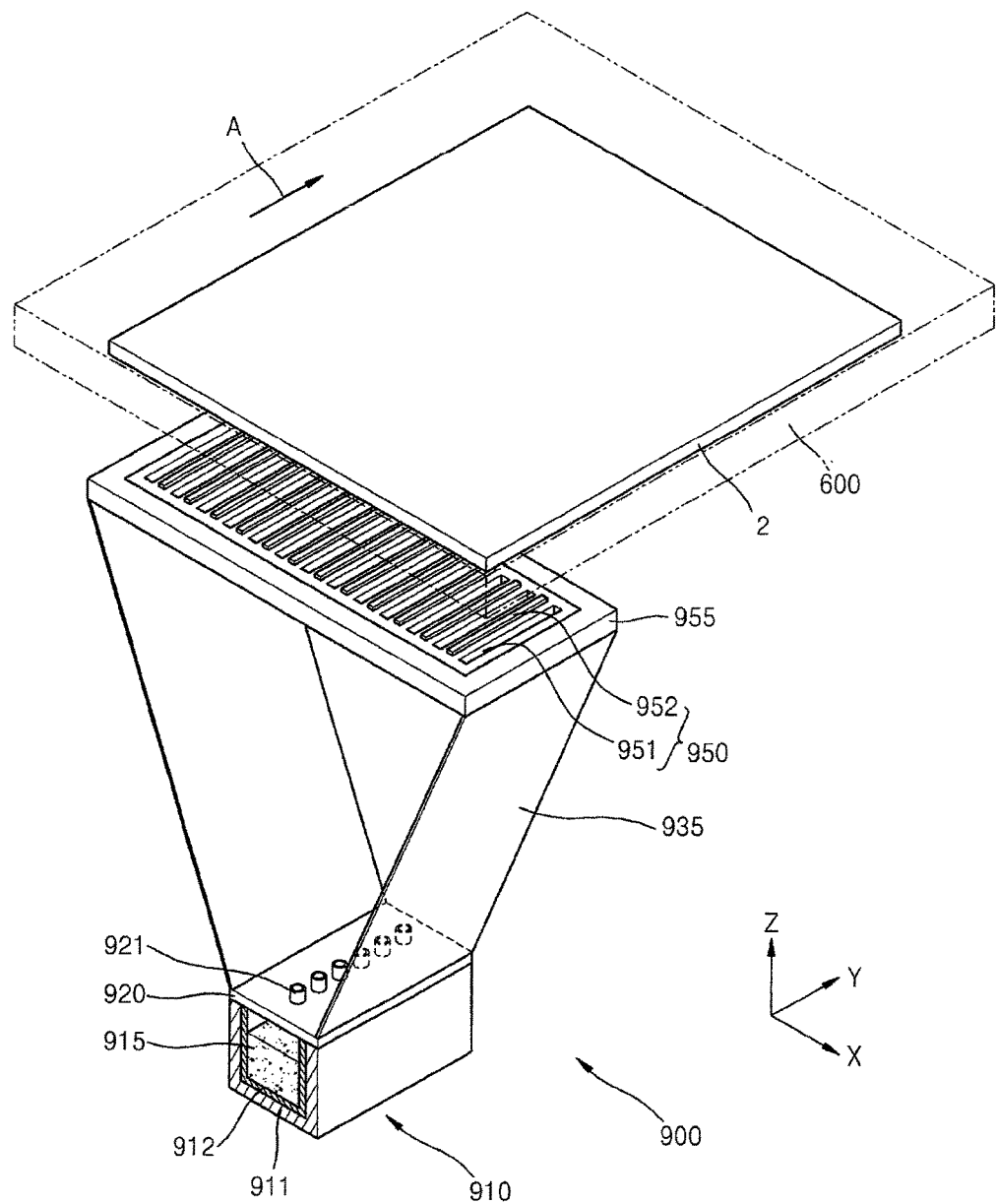
FIG. 23 is a schematic view of an organic layer deposition assembly according to another embodiment of the present invention.

FIG. 23 is a schematic perspective view of an organic layer deposition assembly 900 according to another embodiment of the present invention.

Referring to FIG. 23, the organic layer deposition assembly 900 according to the present embodiment includes a deposition source 910, a deposition source nozzle unit 920, and a patterning slit sheet 950.

The deposition source 910 includes a crucible 911 that is filled with the deposition material 915 and a heater 912 that heats the crucible 911 so as to vaporize the deposition material 915 toward the deposition source nozzle unit 920. The deposition source nozzle unit 920 is located at one side of the deposition source 910. The deposition source nozzle unit 920 includes a plurality of deposition source nozzles 921 arranged along the Y-axis direction. In one embodiment, the patterning slit sheet 950 and a frame 955 may be further located between the deposition source 910 and a substrate 2 attached to an electrostatic chuck 600, and the patterning slit sheet 950 may have a plurality of patterning slits 951 and spacers (or regions) 952 arranged along the X-axis direction. The deposition source 910 and the deposition source nozzle unit 920 may be connected to the patterning slit sheet 950 by a connection member 935.

The present embodiment is different from the previous embodiments in the arrangement of the deposition source nozzles 921 included in the deposition source nozzle unit 920. The difference is described in detail below.

The deposition source nozzle unit 920 is located at one side of the deposition source 910, for example, a side of the deposition source 910 toward the substrate 2. In addition, the deposition source nozzle unit 920 includes deposition source nozzles 921 arranged along the Y-axis direction (that is, the scan direction of the substrate 2). In this regard, the deposition source nozzles 921 may be equidistant from each other. The deposition material 915 that has been vaporized in the deposition source 910 passes through the deposition source nozzle unit 920 and is then moved toward the substrate 2. Ultimately, in an organic layer deposition assembly 900, the deposition source nozzles 921 are arranged along the scan direction of the substrate 2. In this regard, if deposition source nozzles 921 are arranged along the X-axis direction, an interval between each of the deposition source nozzles 921 and the patterning slit 951 may vary and in this case, a shadow may be formed due to a deposition material ejected from a deposition source nozzle that is located relatively far from the patterning slit 951. Accordingly, forming only one deposition source nozzle 921 along the X-axis direction as in the present embodiment may contribute to a substantial decrease in the formation of shadows. In addition, because the deposition source nozzles 921 are arranged along the scan direction, even when a flux difference occurs between individual deposition source nozzles, the flux difference may be offset and thus deposition uniformity may be maintained constant (or substantially constant).

Hereinafter, a structure of an organic layer formed using an organic layer deposition apparatus according to an embodiment of the present invention is described in more detail.

Figure 24:
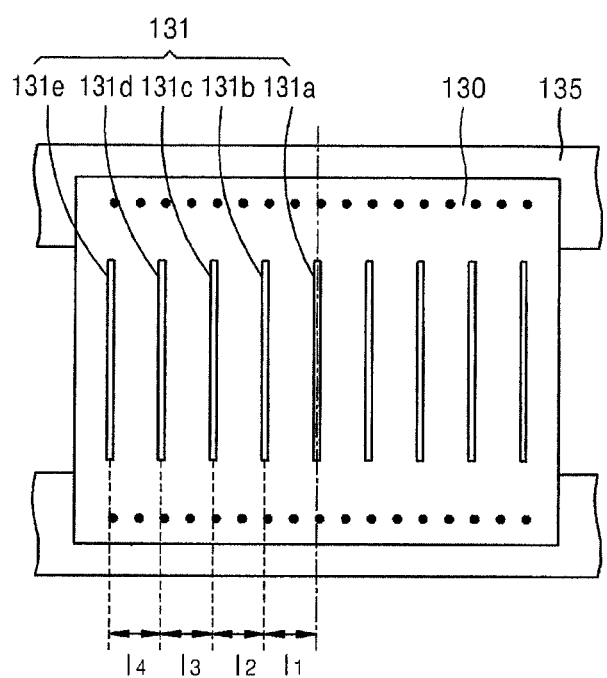
FIG. 24 is a schematic view illustrating equidistant patterning slits of a patterning slit sheet of the organic layer deposition apparatus of FIG. 3.
Figure 25:
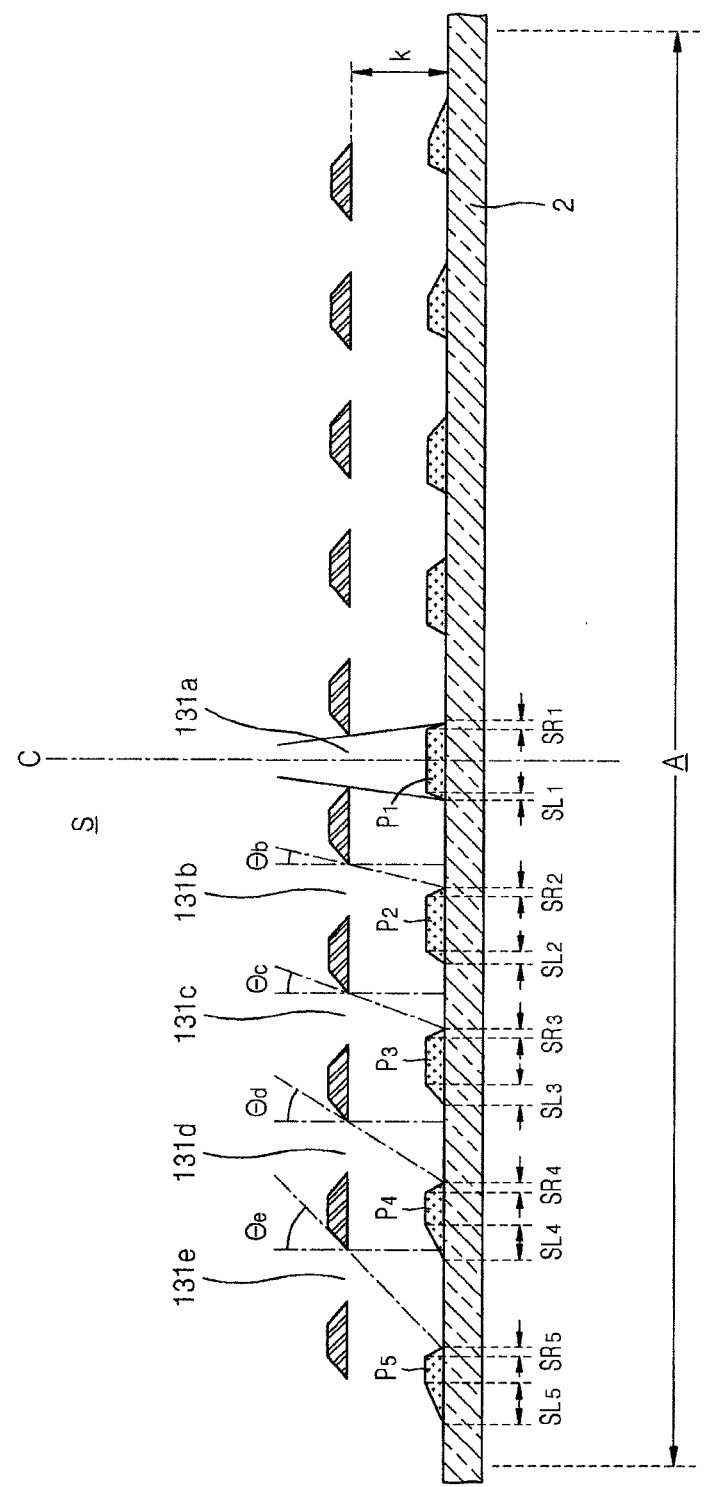
FIG. 25 is a schematic view of organic layers that are formed by using the patterning slit sheet of FIG. 24.

FIG. 24 is a schematic view illustrating equidistant patterning slits 131 of the patterning slit sheet 130 of an organic layer deposition apparatus, and FIG. 25 is a schematic view of an organic layer that is formed by using the patterning slit sheet 130 of FIG. 24.

FIGS. 24 and 25 illustrate the patterning slit sheet 130 in which the patterning slits 131 are equidistant to each other. That is, in FIG. 24, the patterning slits 131 satisfy the following condition: $I_1=I_2=I_3=I_4$.

In this embodiment, an incident angle of a deposition material discharged along a center line C of a deposition space S is substantially perpendicular to the substrate 2. Thus, an organic layer $P_1$ formed using the deposition material that has passed through a patterning slit 131a has a shadow with a minimum (or reduced) size, and a right-side shadow $SR_1$ and a left-side shadow $SL_1$ are formed symmetrical to (or symmetrically with) each other.

However, a critical incident angle θ of the deposition material that passes through patterning slits located farther from the center line C of the deposition space S gradually increases, and thus, the critical incident angle θ of the deposition material that passes through an outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. For example, a left-side shadow $SL_5$ is larger than a right-side shadow $SR_5$.

That is, as the critical incident angle θ of the deposition material increases, the size of the shadow also increases. For example, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits located farther from the center line C of the deposition space S have a larger shadow size. For example, of the shadows on both sides of the respective organic layers, the size of the shadow at a position farther from the center line C of the deposition space S is larger than that of the other.

That is, referring to FIG. 25, the organic layers formed on the left side of the center line C of the deposition space S have a structure in which a left hypotenuse (a slanted side on the left between top and bottom sides) is larger than a right hypotenuse (a slanted side on the right between top and bottom sides), and the organic layers formed on the right side of the center line C of the deposition space S have a structure in which a right hypotenuse (e.g., a right slanted side) is larger than a left hypotenuse (e.g., a left slanted side).

Also, in the organic layers formed on the left side of the center line C of the deposition space S, the length of the left hypotenuse (e.g., the left slanted side) increases towards the left. In the organic layers formed on the right side of the center line C of the deposition space S, the length of the right hypotenuse (e.g., the right slanted side) increases towards the right. Consequently, the organic layers formed in the deposition space S may be formed symmetrical to each other about the center line C of the deposition space S.

This structure will now be described in more detail.

The deposition material that passes through a patterning slit 131b passes through the patterning slit 131b at a critical incident angle of $\theta_b$, and an organic layer $P_2$ formed using the deposition material that has passed through the patterning slit 131b has a left-side shadow having a size of $SL_2$. Likewise, the deposition material that passes through a patterning slit 131c passes through the patterning slit 131c at a critical incident angle of $\theta_c$, and an organic layer $P_3$ formed using the deposition material that has passed through the patterning slit 131c has a left-side shadow having a size of $SL_3$. Likewise, the deposition material that passes through a patterning slit 131d passes through the patterning slit 131d at a critical incident angle of $\theta_d$, and an organic layer $P_4$ formed using the deposition material that has passed through the patterning slit 131d has a left-side shadow having a size of $SL_4$. Likewise, the deposition material that passes through the patterning slit 131e passes through the patterning slit 131e at a critical incident angle of $\theta_e$, and an organic layer $P_5$ formed using the deposition material that has passed through the patterning slit 131e has a left-side shadow having a size of $SL_5$.

In this regard, the critical incident angles satisfy the following condition: $\theta_b<\theta_c<\theta_d<\theta_e$, and thus, the sizes of the shadows of the organic layers also satisfy the following condition: $SL_1<SL_2<SL_3<SL_4<SL_5$.

FIG. 26 is a schematic cross-sectional view of an active matrix-type organic light-emitting display apparatus that is manufactured using an organic layer deposition apparatus according to an embodiment of the present invention.

Referring to FIG. 26, the active matrix organic light-emitting display apparatus 10 according to the present embodiment is formed on a substrate2. The substrate 2 may be formed of a transparent material, for example, glass, plastic, or metal. An insulating layer 51, such as a buffer layer, is formed on an entire surface of the substrate 2. The insulating layer 51 may be omitted in other embodiments.

A thin film transistor (TFT) and an organic light-emitting diode (OLED) are disposed on the insulating layer 51, as illustrated in FIG. 17.

A semiconductor active layer 52 is formed on an upper surface of the insulating layer 51 in a set or predetermined pattern. A gate insulating layer 53 is formed to cover the semiconductor active layer 52. The semiconductor active layer 52 may include a p-type or n-type semiconductor material.

A gate electrode 54 of the TFT is formed in a region of the gate insulating layer 53 corresponding to the semiconductor active layer 52. An interlayer insulating layer 55 is formed to cover the gate electrode 54. After the interlayer insulating layer 55 is formed, the interlayer insulating layer 55 and the gate insulating layer 53 are etched by, for example, dry etching, to form contact holes respectively exposing parts of the semiconductor active layer 52.

Source/drain electrodes 56 and 57 are formed on the interlayer insulating layer 55 to contact the semiconductor active layer 52 through the respective contact holes. A passivation layer 58 is formed to cover the source/drain electrodes 56 and 57, and is etched to expose a part of one of the source/drain electrodes 56 and 57. An insulating layer 59 may be further formed on the passivation layer 58 so as to planarize the passivation layer 58.

In addition, the OLED displays image information (e.g., set or predetermined image information) by emitting red, green, or blue light according to current. The OLED includes a first electrode 61 located on the passivation layer 58. The first electrode 61 is electrically connected to the exposed source/drain electrodes 56 and 57 of the TFT.

A pixel defining layer 60 is formed to cover the first electrode 61. An opening is formed in the pixel-defining layer 60, and an organic layer 62, including an emission layer (EML), is formed in a region defined by the opening. A second electrode 63 is formed on the organic layer 62.

The pixel-defining layer 60, which defines individual pixels, may be formed of an organic material. The pixel-defining layer 60 also planarizes the surface of a region of the substrate 2, in which the first electrode 61 is formed, and in particular, the surface of the insulating layer 59.

The first electrode 61 and the second electrode 63 are electrically insulated from each other, and respectively apply voltages of opposite polarities to the organic layer 62 to induce light emission.

The organic layer 62, including an EML, may be formed of a low-molecular weight organic material or a high-molecular weight organic material. When a low-molecular weight organic material is used, the organic layer 62 may have a single or multi-layer structure including a hole injection layer (HIL), a hole transport layer (HTL), the EML, an electron transport layer (ETL), and/or an electron injection layer (EIL).

Non-limiting examples of available organic materials may include copper phthalocyanine (CuPc), N,N'-di(naphthalene-1-yl)-N,N'-diphenyl-benzidine (NPB), and tris-8-hydroxyquinoline aluminum (Alq3).

The organic layer 62, including an EML, may be formed using the organic layer deposition apparatus according to embodiments of the present invention (for example, see organic layer deposition apparatus 1 of FIG. 1). That is, an organic layer deposition apparatus is disposed spaced apart by a set or predetermined distance from a substrate on which the deposition material is to be deposited, wherein the organic layer deposition apparatus includes a deposition source that discharges a deposition material, a deposition source nozzle unit that is located at one side of the deposition source, wherein the deposition source nozzle unit includes a plurality of deposition source nozzles formed therein, and a patterning slit sheet that faces the deposition source nozzle unit, wherein the patterning slit sheet includes a plurality of patterning slits formed therein. Then, while one of the organic layer deposition apparatus (see 1 of FIG. 1) or a substrate (see 2 of FIG. 1) is relatively moved, the deposition material ejected from the organic layer deposition apparatus (for example, see organic layer deposition apparatus 1 of FIG. 1) is deposited on the substrate (for example, see substrate 2 of FIG. 1).

After the organic layer 62 is formed, the second electrode 63 may be formed by the same (or substantially the same) deposition method as used to form the organic layer 62.

The first electrode 61 may function as an anode, and the second electrode 63 may function as a cathode. Alternatively, the first electrode 61 may function as a cathode, and the second electrode 63 may function as an anode. The first electrode 61 may be patterned to correspond to individual pixel regions, and the second electrode 63 may be formed to cover all the pixels (e.g., cover substantially an entire area of the substrate).

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr), or a compound thereof, and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 63 may also be formed as a transparent electrode or a reflective electrode. When the second electrode 63 is formed as a transparent electrode, the second electrode 63 may be used as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, on a surface of the organic layer 62, and forming an auxiliary electrode layer or a bus electrode line thereon from ITO, IZO, ZnO, $In_2O_3$, or the like. When the second electrode 63 is formed as a reflective electrode, the reflective electrode may be formed by depositing Li, Ca, LiF/Ca, LiF/Al, Al, Ag, Mg, or a compound thereof on the entire surface of the organic layer 62. The second electrode 63 may be formed using the same deposition method as used to form the organic layer 62 described above.

The organic layer deposition apparatuses according to the embodiments of the present invention described above may be applied to form an organic layer or an inorganic layer of an organic TFT, and to form layers from various suitable materials.

According to embodiments of the present invention, an organic layer deposition apparatus that is suitable for use in a mass production of devices on a large substrate, enables high-definition patterning, enables a thickness of an organic layer to be corrected in a reduced time, leading to a high operation rate of the organic layer deposition apparatus, and enables costs for the correction of a thickness of an organic layer to be reduced to decrease manufacturing costs of the organic light-emitting display apparatus, a method of manufacturing an organic light-emitting display apparatus by using the same, and an organic light-emitting display apparatus manufactured using the method, may be provided.

As described above, the one or more embodiments of the present invention provide organic layer deposition apparatuses that are suitable for use in the mass production of a large substrate and enable high-definition patterning, methods of manufacturing organic light-emitting display apparatuses by using the same, and organic light-emitting display apparatuses manufactured using the methods. Although some embodiments of the present invention have been shown and described, it would be appreciated by those skilled in the art that changes may be made to these embodiments without departing from the principles and spirit of the present invention, the scope of which is defined in the claims and their equivalents.

What is claimed is:

1. A method of manufacturing an organic light-emitting display device by using an organic layer deposition apparatus for forming an organic layer on a substrate, the method comprising:
attaching the substrate to a transfer unit in a loading unit;
transporting, into a chamber, the transfer unit to which the substrate is attached, by using a first conveyer unit passing through the chamber;
forming organic layers by depositing deposition materials discharged from a plurality of organic layer deposition assemblies on the substrate while the substrate is spaced apart from and moved relative to the organic layer deposition assemblies in the chamber;

separating the substrate on which the depositing has been completed from the transfer unit in an unloading unit; and transporting the transfer unit from which the substrate is separated to the loading unit by using a second conveyer unit passing through the chamber, wherein each of the organic layer deposition assemblies comprises:
- a plurality of deposition sources, each of the deposition sources being configured to discharge a corresponding one of the deposition materials;
- a deposition source nozzle unit at a side of each of the plurality of deposition sources and comprising one or more deposition source nozzles;
- a patterning slit sheet facing the deposition source nozzle unit and comprising one or more patterning slits; and
- a modification shutter located between the plurality of deposition sources and the patterning slit sheet and having an opening that is configured to allow the corresponding ones of the deposition materials from the deposition sources to pass-through towards the patterning slit sheet, wherein the openings of adjacent ones of the modification shutters are offset from each other along a second direction perpendicular to a first direction in which the substrate is transported, and the deposition materials discharged from the plurality of deposition sources pass through the patterning slit sheet and are deposited on the substrate in patterns.

2. The method of claim 1, wherein the chamber comprises the plurality of the organic layer deposition assemblies, and wherein deposition is sequentially performed on the substrate by using each of the plurality of the organic layer deposition assemblies.

3. The method of claim 1, wherein the transfer unit is moved between the first conveyer unit and the second conveyer unit.

4. The method of claim 1, wherein the first conveyer unit and the second conveyer unit are arranged in parallel to each other above and below.

5. The method of claim 1, wherein the patterning slit sheet of the organic layer deposition assembly is formed smaller than the substrate in at least one of a first direction or the second direction perpendicular to the first direction.

6. The method of claim 1, wherein the opening of each of the modification shutters is elongated in the first direction.

7. The method of claim 1, wherein locations of the openings of the modification shutters are different from each other.

8. The method of claim 1, wherein, when thicknesses of the plurality of organic layers are measured, a modifying substrate is transferred through the organic layer deposition apparatus, and
the modification shutter is located between the plurality of deposition sources and the patterning slit sheet such that the deposition materials are deposited on the modifying substrate by passing through the opening of the modification shutter.

9. The method of claim 8, wherein a deposition unit of the organic layer deposition assemblies comprises m organic layer deposition assemblies, each of the m organic layer deposition assemblies comprises n deposition sources, and each of the m organic layer deposition assemblies comprises one modification shutter, wherein m and n are natural numbers.

10. The method of claim 9, wherein, when the thicknesses of the plurality of organic layers are measured, the (n−1)th deposition source is activated, and the modifying substrate is transferred in the first direction and the deposition material is deposited on the modifying substrate from the activated (n−1)th deposition source while the deposition materials of the deposition sources other than the (n−1)th deposition source are blocked from reaching the modifying substrate, and
after the modifying substrate is out of the deposition unit, the (n)th deposition source is activated, and the modifying substrate is transferred in the first direction and the deposition material is deposited on the modifying substrate from the activated (n)th deposition source while the deposition materials of the deposition sources other than the (n)th deposition source are blocked from reaching the modifying substrate.

11. An organic light-emitting display device comprising:
a substrate;
at least one thin film transistor on the substrate and comprising a semiconductor active layer, a gate electrode insulated from the semiconductor active layer, and source and drain electrodes each contacting the semiconductor active layer;
a plurality of pixel electrodes on the at least one thin film transistor;
a plurality of organic layers on the plurality of the pixel electrodes; and
a counter electrode located on the plurality of organic layers,
wherein a length of a slanted side between top and bottom sides of at least one of the plurality of organic layers on the substrate farther from a center of a deposition region is larger than lengths of slanted sides between respective top and bottom sides of other ones of the plurality of organic layers formed closer to the center of the deposition region, and
the at least one of the plurality of organic layers on the substrate is a linearly-patterned organic layer formed using the method of claim 1.

12. A method of using an apparatus for organic layer deposition for forming an organic material layer on a substrate, the method comprising:
transporting into a channel, a transfer unit on which the substrate is fixed by a first conveyer unit that is configured to pass through a chamber;
forming organic layers on the substrate, when a plurality of organic layer deposition assemblies are a set distance apart from the substrate, the substrate being moved relative to the organic layer deposition assemblies and the organic material layers being formed as deposition materials emitted by the organic layer deposition assemblies are deposited on the substrate; and
transporting the transfer unit from which the substrate is detached back by a second conveyer unit that is configured to pass through the chamber,
wherein the forming of the organic material layers comprises an operation in which, while the substrate for tooling is being transported in the organic layer deposition assemblies, the deposition material is deposited onto the tooling substrate by a first tooling shutter in which one or more tooling slits are formed.

13. The method of claim 12, wherein the first tooling shutter is arranged in each of the plurality of organic layer deposition assemblies, and the tooling slits formed in the first tooling shutters are formed to be at least partially offset to one another.

14. The method of claim 13, wherein the first tooling shutter is arranged in an organic layer deposition assembly for depositing a common layer, among the plurality of organic layer deposition assemblies.

15. The method of claim 12, wherein the first tooling shutter is arranged to cover at least a portion of the substrate only while the tooling substrate is being transported in the organic layer deposition assemblies.

16. The method of claim 12, further comprising an operation in which the substrate is fixed to the transfer unit at a loading unit before the transfer unit is transported by the first conveyer unit; and
an operation in which the substrate, to which deposition is completed, is detached from the transfer unit at an unloading unit before the transfer unit is transported back by the second conveyer unit.

17. The method of claim 16, wherein the transfer unit moves back and forth between the first conveyer unit and the second conveyer unit.

18. The method of claim 16, wherein the first conveyer unit and the second conveyer unit are arranged next to each other in a vertical direction.

19. The method of claim 16, wherein each of the organic layer deposition assemblies comprises:
a deposition source, which emits a deposition material;
a deposition source nozzle unit, which is arranged at one side of the deposition source, the deposition source nozzle unit comprising a plurality of deposition source nozzles; and
a patterning slit sheet, which is arranged to face the deposition source nozzle unit, the patterning slit sheet comprising a plurality of patterning slits arranged in a direction,
wherein the deposition material emitted by the deposition source passes through the patterning slit sheet and is deposited to form a pattern on the substrate.

20. The method of claim 19, wherein, in an organic layer deposition assembly for depositing a pattern layer among the plurality of organic layer deposition assemblies, a second tooling shutter, which is arranged between the deposition source nozzle unit and the patterning slit sheet to cover at least a portion of the substrate and includes tooling slits formed at two opposite ends, is formed.

21. The method of claim 20, wherein a width of the tooling slit of the second tooling shutter is greater than a width of the patterning slit of the patterning slit sheet.

22. The method of claim 19, wherein the patterning slit sheet of the organic layer deposition assembly is formed smaller than the substrate in at least any one of a first direction and a second direction perpendicular to the first direction.

23. An organic light-emitting display apparatus comprising:
a substrate;
at least one thin film transistor on the substrate and comprises a semiconductor active layer, a gate electrode insulated from the semiconductor active layer, and source and drain electrodes each contacting the semiconductor active layer;
a plurality of pixel electrodes on the at least one thin film transistor;
a plurality of organic layers on the plurality of the pixel electrodes; and
a counter electrode on the plurality of organic layers,
wherein a length of a slanted side between top and bottom sides of at least one of the plurality of organic layers formed on the substrate farther from a center of a deposition region is larger than lengths of slated sides between respective top and bottom sides of other ones of the plurality of organic layers closer to the center of the deposition region,
wherein the at least one of the plurality of organic layers formed on the substrate is a linearly-patterned organic layer formed using the method of claim 5.

* * * * *